United States Patent
Jiang et al.

(10) Patent No.: US 9,589,792 B2
(45) Date of Patent: Mar. 7, 2017

(54) HIGH QUALITY GROUP-III METAL NITRIDE CRYSTALS, METHODS OF MAKING, AND METHODS OF USE

(71) Applicant: SORAA, INC., Fremont, CA (US)

(72) Inventors: Wenkan Jiang, Santa Barbara, CA (US); Mark P. D'Evelyn, Santa Barbara, CA (US); Derrick S. Kamber, Goleta, CA (US); Dirk Ehrentraut, Santa Barbara, CA (US); Michael Krames, Mountain View, CA (US)

(73) Assignee: Soraa, Inc., Fremont, CA (US)

( * ) Notice: Subject to any disclaimer, the term of this patent is extended or adjusted under 35 U.S.C. 154(b) by 468 days.

(21) Appl. No.: 14/089,281

(22) Filed: Nov. 25, 2013

(65) Prior Publication Data

US 2014/0147650 A1  May 29, 2014

Related U.S. Application Data

(60) Provisional application No. 61/729,975, filed on Nov. 26, 2012.

(51) Int. Cl.
  *H01L 29/20* (2006.01)
  *H01L 21/02* (2006.01)
  (Continued)

(52) U.S. Cl.
  CPC .......... *H01L 21/0254* (2013.01); *C30B 7/105* (2013.01); *C30B 29/403* (2013.01);
  (Continued)

(58) Field of Classification Search
  None
  See application file for complete search history.

(56) References Cited

U.S. PATENT DOCUMENTS

| | | | |
|---|---|---|---|
| 4,030,966 A | 6/1977 | Hornig et al. | |
| 4,066,868 A | 1/1978 | Witkin et al. | |
| (Continued) | | | |

FOREIGN PATENT DOCUMENTS

| | | |
|---|---|---|
| CN | 101061570 | 10/2007 |
| JP | 2005-289797 | 10/2005 |
| (Continued) | | |

OTHER PUBLICATIONS

Aguilar, 'Ohmic n-contacts to Gallium Nitride Light Emitting Diodes', National Nanotechnology Infrastructure Network, 2007 (pp. 56-81).

(Continued)

*Primary Examiner* — David Sample
*Assistant Examiner* — Donald M Flores, Jr.
(74) *Attorney, Agent, or Firm* — Saul Ewing LLP

(57) ABSTRACT

High quality ammonothermal group III metal nitride crystals having a pattern of locally-approximately-linear arrays of threading dislocations, methods of manufacturing high quality ammonothermal group III metal nitride crystals, and methods of using such crystals are disclosed. The crystals are useful for seed bulk crystal growth and as substrates for light emitting diodes, laser diodes, transistors, photodetectors, solar cells, and for photoelectrochemical water splitting for hydrogen generation devices.

32 Claims, 21 Drawing Sheets

(51) Int. Cl.
  *H01L 33/00* (2010.01)
  *C30B 7/10* (2006.01)
  *C30B 29/40* (2006.01)
(52) U.S. Cl.
  CPC .... *H01L 21/0237* (2013.01); *H01L 21/02458* (2013.01); *H01L 21/02642* (2013.01); *H01L 21/02647* (2013.01); *H01L 33/0075* (2013.01)

(56) References Cited

U.S. PATENT DOCUMENTS

| | | | |
|---|---|---|---|
| 4,350,560 A | 9/1982 | Helgeland et al. | |
| 4,870,045 A | 9/1989 | Gasper et al. | |
| 5,098,673 A | 3/1992 | Engel et al. | |
| 5,169,486 A | 12/1992 | Young et al. | |
| 6,129,900 A | 10/2000 | Satoh et al. | |
| 6,273,948 B1 | 8/2001 | Porowski et al. | |
| 6,398,867 B1 | 6/2002 | D'Evelyn et al. | |
| 6,406,540 B1 | 6/2002 | Harris et al. | |
| 6,528,427 B2 | 3/2003 | Chebi et al. | |
| 6,596,079 B1 | 7/2003 | Vaudo et al. | |
| 6,656,615 B2 | 12/2003 | Dwilinski et al. | |
| 6,686,608 B1 | 2/2004 | Takahira | |
| 6,764,297 B2 | 7/2004 | Godwin et al. | |
| 6,765,240 B2 | 7/2004 | Tischler et al. | |
| 6,784,463 B2 | 8/2004 | Camras et al. | |
| 6,787,814 B2 | 9/2004 | Udagawa | |
| 6,861,130 B2 | 3/2005 | D'Evelyn et al. | |
| 6,887,144 B2 | 5/2005 | D'Evelyn et al. | |
| 7,001,577 B2 | 2/2006 | Zimmerman et al. | |
| 7,026,756 B2 | 4/2006 | Shimizu et al. | |
| 7,053,413 B2 | 5/2006 | D'Evelyn et al. | |
| 7,063,741 B2 | 6/2006 | D'Evelyn et al. | |
| 7,078,731 B2 * | 7/2006 | D'Evelyn | B82Y 10/00 257/103 |
| 7,098,487 B2 | 8/2006 | D'Evelyn et al. | |
| 7,112,829 B2 | 9/2006 | Picard et al. | |
| 7,119,372 B2 | 10/2006 | Stokes et al. | |
| 7,125,453 B2 | 10/2006 | D'Evelyn et al. | |
| 7,160,531 B1 | 1/2007 | Jacques et al. | |
| 7,170,095 B2 | 1/2007 | Vaudo et al. | |
| 7,175,704 B2 | 2/2007 | D'Evelyn et al. | |
| 7,198,671 B2 | 4/2007 | Ueda | |
| 7,252,712 B2 | 8/2007 | Dwilinski et al. | |
| 7,279,040 B1 | 10/2007 | Wang | |
| 7,316,746 B2 | 1/2008 | D'Evelyn et al. | |
| 7,368,015 B2 | 5/2008 | D'Evelyn et al. | |
| 7,381,391 B2 | 6/2008 | Spencer et al. | |
| 7,420,261 B2 | 9/2008 | Dwilinski et al. | |
| 7,470,938 B2 | 12/2008 | Lee et al. | |
| 7,569,206 B2 | 8/2009 | Spencer et al. | |
| 7,625,446 B2 | 12/2009 | D'Evelyn et al. | |
| 7,642,122 B2 * | 1/2010 | Tysoe | C30B 29/403 257/98 |
| 7,704,324 B2 | 4/2010 | D'Evelyn et al. | |
| 7,705,276 B2 | 4/2010 | Giddings et al. | |
| 7,759,710 B1 | 7/2010 | Chiu et al. | |
| 7,976,630 B2 | 7/2011 | Poblenz et al. | |
| 8,021,481 B2 | 9/2011 | D'Evelyn | |
| 8,048,225 B2 | 11/2011 | Poblenz et al. | |
| 8,097,081 B2 | 1/2012 | D'Evelyn | |
| 8,148,180 B2 | 4/2012 | Felker et al. | |
| 8,148,801 B2 | 4/2012 | D'Evelyn | |
| 8,278,656 B2 | 10/2012 | Mattmann et al. | |
| 8,303,710 B2 | 11/2012 | D'Evelyn | |
| 8,306,081 B1 | 11/2012 | Schmidt et al. | |
| 8,313,964 B2 | 11/2012 | Sharma et al. | |
| 8,323,405 B2 | 12/2012 | D'Evelyn | |
| 8,329,511 B2 | 12/2012 | D'Evelyn | |
| 8,354,679 B1 | 1/2013 | D'Evelyn et al. | |
| 8,430,958 B2 | 4/2013 | D'Evelyn | |
| 8,435,347 B2 | 5/2013 | D'Evelyn et al. | |
| 8,444,765 B2 | 5/2013 | D'Evelyn | |
| 8,461,071 B2 | 6/2013 | D'Evelyn | |
| 8,465,588 B2 | 6/2013 | Poblenz et al. | |
| 8,482,104 B2 | 7/2013 | D'Evelyn et al. | |
| 8,492,185 B1 | 7/2013 | D'Evelyn et al. | |
| 8,802,471 B1 | 8/2014 | Cich et al. | |
| 2001/0011935 A1 | 8/2001 | Lee et al. | |
| 2002/0155691 A1 | 10/2002 | Lee et al. | |
| 2002/0189532 A1 | 12/2002 | Motoki et al. | |
| 2003/0027014 A1 | 2/2003 | Johnson et al. | |
| 2003/0127041 A1 | 7/2003 | Xu et al. | |
| 2003/0128041 A1 | 7/2003 | Byrd | |
| 2003/0138732 A1 | 7/2003 | Nagase | |
| 2003/0140845 A1 * | 7/2003 | D'Evelyn | B01J 3/062 117/8 |
| 2003/0145784 A1 | 8/2003 | Thompson et al. | |
| 2003/0183155 A1 | 10/2003 | D'Evelyn et al. | |
| 2003/0209191 A1 | 11/2003 | Purdy | |
| 2003/0232512 A1 | 12/2003 | Dickinson et al. | |
| 2004/0000266 A1 | 1/2004 | D'Evelyn et al. | |
| 2004/0023427 A1 | 2/2004 | Chua et al. | |
| 2005/0087753 A1 | 4/2005 | D'Evelyn et al. | |
| 2005/0098095 A1 | 5/2005 | D'Evelyn et al. | |
| 2005/0128469 A1 | 6/2005 | Hall et al. | |
| 2005/0152820 A1 | 7/2005 | D'Evelyn et al. | |
| 2005/0205215 A1 | 9/2005 | Giddings et al. | |
| 2006/0032428 A1 | 2/2006 | Dwilinski et al. | |
| 2006/0037529 A1 | 2/2006 | D'Evelyn et al. | |
| 2006/0037530 A1 | 2/2006 | Dwilinski et al. | |
| 2006/0048699 A1 | 3/2006 | D'Evelyn et al. | |
| 2006/0084245 A1 * | 4/2006 | Kohda | H01L 21/0237 438/478 |
| 2006/0096521 A1 | 5/2006 | D'Evelyn et al. | |
| 2006/0124051 A1 | 6/2006 | Yoshioka et al. | |
| 2006/0177362 A1 | 8/2006 | D'Evelyn et al. | |
| 2006/0207497 A1 | 9/2006 | D'Evelyn et al. | |
| 2006/0288927 A1 | 12/2006 | Chodelka et al. | |
| 2007/0057337 A1 | 3/2007 | Kano et al. | |
| 2007/0105351 A1 | 5/2007 | Motoki et al. | |
| 2007/0141819 A1 | 6/2007 | Park et al. | |
| 2007/0142204 A1 | 6/2007 | Park et al. | |
| 2007/0151509 A1 | 7/2007 | Park et al. | |
| 2007/0158785 A1 | 7/2007 | D'Evelyn et al. | |
| 2007/0178039 A1 | 8/2007 | D'Evelyn et al. | |
| 2007/0181056 A1 | 8/2007 | D'Evelyn et al. | |
| 2007/0197004 A1 | 8/2007 | Dadgar et al. | |
| 2007/0210074 A1 | 9/2007 | Maurer et al. | |
| 2007/0215033 A1 | 9/2007 | Imaeda et al. | |
| 2007/0218703 A1 | 9/2007 | Kaeding et al. | |
| 2007/0231978 A1 | 10/2007 | Kanamoto et al. | |
| 2007/0252164 A1 | 11/2007 | Zhong et al. | |
| 2007/0264733 A1 | 11/2007 | Choi et al. | |
| 2007/0274359 A1 | 11/2007 | Takeuchi et al. | |
| 2008/0006831 A1 | 1/2008 | Ng | |
| 2008/0025360 A1 | 1/2008 | Eichler et al. | |
| 2008/0056984 A1 | 3/2008 | Yoshioka et al. | |
| 2008/0083741 A1 | 4/2008 | Giddings et al. | |
| 2008/0083970 A1 | 4/2008 | Kamber et al. | |
| 2008/0087919 A1 | 4/2008 | Tysoe et al. | |
| 2008/0096470 A1 | 4/2008 | Hou et al. | |
| 2008/0156254 A1 | 7/2008 | Dwilinski et al. | |
| 2008/0193363 A1 | 8/2008 | Tsuji | |
| 2009/0092536 A1 | 4/2009 | Kawabata et al. | |
| 2009/0140287 A1 | 6/2009 | Fujiwara et al. | |
| 2009/0218593 A1 | 9/2009 | Kamikawa et al. | |
| 2009/0250686 A1 | 10/2009 | Sato et al. | |
| 2009/0301387 A1 | 12/2009 | D'Evelyn | |
| 2009/0301388 A1 | 12/2009 | D'Evelyn | |
| 2009/0309105 A1 | 12/2009 | Letts et al. | |
| 2009/0309110 A1 | 12/2009 | Raring et al. | |
| 2009/0320745 A1 | 12/2009 | D'Evelyn et al. | |
| 2010/0001300 A1 | 1/2010 | Raring et al. | |
| 2010/0003492 A1 | 1/2010 | D'Evelyn | |
| 2010/0003942 A1 | 1/2010 | Ikeda et al. | |
| 2010/0025656 A1 | 2/2010 | Raring et al. | |
| 2010/0031872 A1 | 2/2010 | D'Evelyn | |
| 2010/0031873 A1 | 2/2010 | D'Evelyn | |
| 2010/0031874 A1 | 2/2010 | D'Evelyn | |
| 2010/0031875 A1 | 2/2010 | D'Evelyn | |
| 2010/0031876 A1 | 2/2010 | D'Evelyn | |
| 2010/0075175 A1 | 3/2010 | Poblenz et al. | |
| 2010/0104495 A1 | 4/2010 | Kawabata et al. | |

(56) References Cited

U.S. PATENT DOCUMENTS

| | | | |
|---|---|---|---|
| 2010/0108985 A1 | 5/2010 | Chung et al. | |
| 2010/0109126 A1 | 5/2010 | Arena | |
| 2010/0147210 A1 | 6/2010 | D'Evelyn | |
| 2010/0151194 A1 | 6/2010 | D'Evelyn | |
| 2010/0189981 A1 | 7/2010 | Poblenz et al. | |
| 2010/0243988 A1 | 9/2010 | Kamikawa et al. | |
| 2011/0062415 A1 | 3/2011 | Ohta et al. | |
| 2011/0064103 A1 | 3/2011 | Ohta et al. | |
| 2011/0100291 A1 | 5/2011 | D'Evelyn | |
| 2011/0101400 A1 | 5/2011 | Chu et al. | |
| 2011/0101414 A1 | 5/2011 | Thompson et al. | |
| 2011/0124139 A1 | 5/2011 | Chang | |
| 2011/0158275 A1 | 6/2011 | Yoshizumi et al. | |
| 2011/0183498 A1 | 7/2011 | D'Evelyn | |
| 2011/0186860 A1 | 8/2011 | Enya et al. | |
| 2011/0220912 A1 | 9/2011 | D'Evelyn | |
| 2011/0256693 A1 | 10/2011 | D'Evelyn et al. | |
| 2011/0260189 A1 | 10/2011 | Kim | |
| 2011/0309373 A1 | 12/2011 | Sharma et al. | |
| 2012/0000415 A1 | 1/2012 | D'Evelyn et al. | |
| 2012/0091465 A1 | 4/2012 | Krames et al. | |
| 2012/0104359 A1 | 5/2012 | Felker et al. | |
| 2012/0104412 A1 | 5/2012 | Zhong et al. | |
| 2012/0118223 A1 | 5/2012 | D'Evelyn | |
| 2012/0119218 A1 | 5/2012 | Su | |
| 2012/0137966 A1 | 6/2012 | D'Evelyn et al. | |
| 2013/0112987 A1 | 5/2013 | Fu et al. | |
| 2013/0119401 A1 | 5/2013 | D'Evelyn et al. | |
| 2013/0126902 A1 | 5/2013 | Isozaki et al. | |
| 2013/0251615 A1 | 9/2013 | D'Evelyn et al. | |
| 2013/0323490 A1* | 12/2013 | D'Evelyn | C30B 7/105 428/220 |
| 2014/0050244 A1 | 2/2014 | Ohno et al. | |
| 2014/0065360 A1 | 3/2014 | D'Evelyn et al. | |

FOREIGN PATENT DOCUMENTS

| | | |
|---|---|---|
| WO | WO 2006/057463 | 1/2006 |
| WO | WO 2006/038467 | 4/2006 |
| WO | WO 2007/004495 | 1/2007 |
| WO | WO 2010/068916 | 6/2010 |
| WO | WO 2011/044554 | 4/2011 |
| WO | WO 2012/016033 | 2/2012 |

OTHER PUBLICATIONS

Lu et al., 'Etch-Pits of GaN Films with Different Etching Methods', Journal of the Korean Physical Society, vol. 45, Dec. 2004 (pp. S673-S675).

Rickert et al., 'n-GaN Surface Treatments for Metal Contacts Studied Via X-ray Photoemission Spectroscopy', Applied Physics Letters, vol. 80, No. 2, Jan. 14, 2002 (3 pages).

Selvanathan et al., 'Investigation of Surface Treatment Schemes on n-type GaN and Al 0.20Ga0.80N', Journal of Vacuum Science and Technology B, vol. 23, No. 6, 2005 (7 pages).

Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007 (18 pages).

USPTO Office Action for U.S. Appl. No. 13/723,968 dated Nov. 29, 2013 (25 pages).

USPTO Notice of Allowance for U.S. Appl. No. 13/723,968 dated Apr. 28, 2014 (8 pages).

USPTO Office Action for U.S. Appl. No. 12/133,365 dated Feb. 20, 2014, 32 pages.

USPTO Office Action for U.S. Appl. No. 12/636,683 dated Feb. 24, 2014, 16 pages.

USPTO Notice of Allowance for U.S. Appl. No. 13/272,981 dated Mar. 13, 2014, 10 pages.

USPTO Office Action for U.S. Appl. No. 13/600,191 dated Mar. 11, 2015 (9 pages).

Altoukhov et al., 'High reflectivity airgap distributed Bragg reflectors realized by wet etching of AlInN sacrificial layers', Applied Physics Letters, vol. 95, 2009, pp. 191102-1-191102-3.

Callahan et al., 'Synthesis and Growth of Gallium Nitride by the Chemical Vapor Reaction Process (CVRP)', MRS Internet Journal Nitride Semiconductor Research, vol. 4, No. 10, 1999, pp. 1-6.

Choi et al., '2.5l microcavity InGaN light-emitting diodes fabricated by a selective dry-etch thinning process', Applied Physics Letters, 2007, 91(6), 061120.

Copel et al., 'Surfactants in Epitaxial Growth', Physical Review Letters, Aug. 7, 1989, vol. 63, No. 6, p. 632-635.

D'Evelyn et al., 'Bulk GaN Crystal Growth by the High-Pressure Ammonothermal Method', Journal of Crystal Growth, vol. 300, 2007, pp. 11-16.

Dorsaz et al., 'Selective oxidation of AlInN Layers for current confinement III-nitride devices', Applied Physics Letters, vol. 87, 2005, pp. 072102.

Ehrentraut et al., 'The ammonothermal crystal growth of gallium nitride—A technique on the up rise', Proceedings IEEE, 2010, 98(7), pp. 1316-1323.

Fang., 'Deep centers in semi-insulating Fe-doped native GaN substrates grown by hydride vapour phase epitaxy', Physica Status Solidi, vol. 5, No. 6, 2008, pp. 1508-1511.

Fujito et al., 'Development of Bulk GaN Crystals and Nonpolar/Semipolar Substrates by HVPE', MRS Bulletin, May 2009, vol. 34, No. 5, pp. 313-317.

Fukuda et al., 'Prospects for the Ammonothermal Growth of Large GaN Crystal', Journal of Crystal Growth, vol. 305, 2007, pp. 304-310.

Gladkov et al., 'Effect of Fe doping on optical properties of freestanding semi-insulating HVPE GaN:Fe', Journal of Crystal Growth, 312, pp. 1205-1209, Year: 2010.

Grzegory, 'High pressure growth of bulk GaN from Solutions in gallium', Journal of Physics Condensed Matter, vol. 13, 2001, pp. 6875-6892.

Lide et al., 'Thermal Conductivity of Ceramics and Other Insulating Materials', CRC Handbook of Chemistry and Physics, 91st Edition, 2010-2011, pp. 12-203 and 12-204.

Lu et al., 'Structure of the CI-passivated GaAs(111) surface', Physical Review B, Nov. 15, 1998, vol. 58, No. 20, pp. 13820-13823.

Massies et al., 'Surfactant mediated epitaxial growth of InxGal-xAs on GaAs (001)', Applied Physics Letters, vol. 61, No. 1, Jul. 6, 1992, pp. 99-101.

http://www.matbase.com/material/non-ferrous-metals/other/molybdenum/properties, Data Table For: Non-Ferrous Metals: Other Metals: Molybdenum, Mar. 28, 2011, pp. 1.

Moutanabbir, 'Bulk GaN Ion Cleaving', Journal of Electronic Materials, vol. 39, 2010, pp. 482-488.

Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, pp. 103509-1-103509-4.

Pattison et al., 'Gallium Nitride Based Microcavity Light Emitting Diodes With 2? Effective Cavity Thickness', Applied Physics Letters, vol. 90, Issue 3, 031111 (2007) 3pg.

International Search Report & Written Opinion of PCT Application No. PCT/US2009/067745, dated Feb. 5, 2010, 9 pages total.

Porowski, 'High Resistivity GaN Single Crystalline Substrates', Acta Physica Polonica A, vol. 92, No. 2, 1997, pp. 958-962.

Porowski, 'Near Defect Free GaN Substrates', Journal of Nitride Semiconductor, 1999, pp. 1-11.

Sarva et al., 'Dynamic Compressive Strength of Silicon Carbide Under Uniaxial Compression', Material Sciences and Engineering, vol. A317, 2001, pp. 140-144.

Sharma et al., 'Vertically oriented GaN-based air-gap distributed Bragg reflector structure fabricated using band-gap-selective photoelectrochemical etching', Applied Physics Letters, vol. 87, 2005, pp. 051107.

Sumiya et al., 'High-pressure synthesis of high-purity diamond crystal', Diamond and Related Materials, 1996, vol. 5, pp. 1359-1365.

(56) References Cited

OTHER PUBLICATIONS

Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
Communication from the Polish Patent Office re P394857 dated Jan. 22, 2013, (2 pages).
Communication from the Chinese Patent Office re 200980134876.2 dated Jul. 3, 2013, (14 pages).
Communication from the Polish Patent Office re P394857 dated Aug. 14, 2013, (2 pages).
Wang et al , 'Ammonothermal Growth of GaN Crystals in Alkaline Solutions', Journal of Crystal Growth, vol. 287, 2006, pp. 376-380.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).
USPTO Office Action for U.S. Appl. No. 12/133,364 dated Nov. 26, 2010 (5 pages).
USPTO Office Action for U.S. Appl. No. 12/133,364 dated Jun. 1, 2011 (7 pages).
USPTO Notice of Allowance for U.S. Appl. No. 12/133,364 dated Oct. 11, 2011 (5 pages).
USPTO Office Action for U.S. Appl. No. 12/133,365 dated Jun. 9, 2011 (16 pages).
USPTO Office Action for U.S. Appl. No. 12/133,365 dated Oct. 18, 2011 (21 pages).
USPTO Office Action for U.S. Appl. No. 12/133,365 dated May 13, 2013 (22 pages).
USPTO Office Action for U.S. Appl. No. 12/133,365 dated Aug. 21, 2013 (28 pages).
USPTO Office Action for U.S. Appl. No. 12/334,418 dated Apr. 5, 2011 (19 pages).
USPTO Office Action for U.S. Appl. No. 12/334,418 dated Oct. 19, 2011 (23 pages).
USPTO Office Action for U.S. Appl. No. 12/334,418 dated Sep. 17, 2013 (26 pages).
USPTO Office Action for U.S. Appl. No. 12/478,736 dated Sep. 27, 2011 (10 pages).
USPTO Office Action for U.S. Appl. No. 12/478,736 dated Feb. 7, 2012 (6 pages).
USPTO Notice of Allowance for U.S. Appl. No. 12/478,736 dated Apr. 23, 2012 (7 pages).
USPTO Notice of Allowance for U.S. Appl. No. 12/478,736 dated Oct. 9, 2012 (4 pages).
USPTO Office Action for U.S. Appl. No. 12/484,095 dated Nov. 10, 2010 (8 pages).
USPTO Office Action for U.S. Appl. No. 12/484,095 dated Jul. 8, 2011 (11 pages).
USPTO Office Action for U.S. Appl. No. 12/497,969 dated Feb. 2, 2012 (19 pages).
USPTO Office Action for U.S. Appl. No. 12/497,969 dated Jul. 5, 2012 (17 pages).
USPTO Office Action for U.S. Appl. No. 12/497,969 dated May 16, 2013 (21 pages).
USPTO Office Action for U.S. Appl. No. 12/497,969 dated Sep. 6, 2013 (20 pages).
USPTO Office Action for U.S. Appl. No. 12/534,843 dated Sep. 10, 2012 (9 pages).
USPTO Notice of Allowance for U.S. Appl. No. 12/534,843 dated Jan. 24, 2013 (8 pages).
USPTO Office Action for U.S. Appl. No. 12/534,844 dated Sep. 16, 2010 (8 pages).
USPTO Office Action for U.S. Appl. No. 12/534,844 dated Feb. 4, 2011 (9 pages).
USPTO Notice of Allowance for U.S. Appl. No. 12/534,849 dated Jul. 31, 2012 (11 pages).
USPTO Office Action for U.S. Appl. No. 12/534,857 dated Sep. 1, 2010 (10 pages).
USPTO Notice of Allowance for U.S. Appl. No. 12/534,857 dated May 27, 2011 (5 pages).
USPTO Office Action for U.S. Appl. No. 12/546,458 dated Jul. 20, 2011 (4 pages).
USPTO Notice of Allowance for U.S. Appl. No. 12/546,458 dated Nov. 28, 2011 (5 pages).
USPTO Office Action for U.S. Appl. No. 12/556,558 dated Sep. 16, 2010 (8 pages).
USPTO Notice of Allowance for U.S. Appl. No. 12/556,558 dated Mar. 22, 2011 (5 pages).
USPTO Office Action for U.S. Appl. No. 12/556,562 dated Sep. 15, 2010 (7 pages).
USPTO Office Action for U.S. Appl. No. 12/556,562 dated Mar. 21, 2011 (5 pages).
USPTO Notice of Allowance for U.S. Appl. No. 12/556,562 dated Jul. 27, 2011 (5 pages).
USPTO Office Action for U.S. Appl. No. 12/569,337 dated May 9, 2012 (18 pages).
USPTO Notice of Allowance for U.S. Appl. No. 12/569,337 dated Nov. 15, 2012 (5 pages).
USPTO Office Action for U.S. Appl. No. 12/569,844 dated Oct. 12, 2012 (12 pages).
USPTO Office Action for U.S. Appl. No. 12/634,665 dated Apr. 25, 2012 (10 pages).
USPTO Office Action for U.S. Appl. No. 12/634,665 dated Oct. 1, 2012 (10 pages).
USPTO Notice of Allowance for U.S. Appl. No. 12/634,665 dated Feb. 15, 2013 (9 pages).
USPTO Office Action for U.S. Appl. No. 12/636,683 dated Jun. 12, 2013 (14 pages).
USPTO Office Action for U.S. Appl. No. 12/636,683 dated Aug. 16, 2013 (16 pages).
USPTO Office Action for U.S. Appl. No. 12/697,171 dated Jun. 20, 2013 (16 pages).
USPTO Office Action for U.S. Appl. No. 12/697,171 dated Aug. 20, 2013 (17 pages).
USPTO Office Action for U.S. Appl. No. 12/724,983 dated Mar. 5, 2012 (20 pages).
USPTO Office Action for U.S. Appl. No. 12/785,404 dated Mar. 6, 2012 (9 pages).
USPTO Notice of Allowance for U.S. Appl. No. 12/785,404 dated Jul. 16, 2012 (5 pages).
USPTO Office Action for U.S. Appl. No. 12/891,668 dated Sep. 25, 2012 (20 pages).
USPTO Office Action for U.S. Appl. No. 12/891,668 dated Jan. 10, 2013 (30 pages).
USPTO Notice of Allowance for U.S. Appl. No. 12/891,668 dated Mar. 20, 2013 (13 pages).
USPTO Office Action for U.S. Appl. No. 13/025,833 dated Jul. 12, 2012 (15 pages).
USPTO Office Action for U.S. Appl. No. 13/041,199 dated Nov. 30, 2012 (13 pages).
USPTO Office Action for U.S. Appl. No. 13/041,199 dated Mar. 12, 2013 (9 pages).
USPTO Office Action for U.S. Appl. No. 13/175,739 dated Dec. 7, 2012 (5 pages).
USPTO Notice of Allowance for U.S. Appl. No. 13/175,739 dated Mar. 21, 2013 (6 pages).
USPTO Office Action for U.S. Appl. No. 13/179,346 dated Dec. 13, 2012 (20 pages).
USPTO Office Action for U.S. Appl. No. 13/226,249 dated Oct. 10, 2012 (7 pages).
USPTO Notice of Allowance for U.S. Appl. No. 13/226,249 dated Feb. 21, 2013 (5 pages).
USPTO Office Action for U.S. Appl. No. 13/272,981 dated Mar. 20, 2013 (18 pages).
USPTO Office Action for U.S. Appl. No. 13/272,981 dated Aug. 15, 2013 (13 pages).
USPTO Office Action for U.S. Appl. No. 13/346,507 dated Dec. 21, 2012 (8 pages).
USPTO Notice of Allowance for U.S. Appl. No. 13/346,507 dated Apr. 22, 2013 (8 pages).

(56) References Cited

OTHER PUBLICATIONS

USPTO Notice of Allowance for U.S. Appl. No. 13/425,304 dated Aug. 22, 2012 (7 pages).
USPTO Office Action for U.S. Appl. No. 13/472,356 dated Dec. 9, 2013 (11 pages).
USPTO Notice of Allowance for U.S. Appl. No. 13/548,931 dated Jun. 3, 2013 (10 pages).

* cited by examiner

HIGH QUALITY GROUP-III METAL NITRIDE CRYSTALS, METHODS OF MAKING, AND METHODS OF USE

This application claims the benefit under 35 U.S.C. §119 (e) of U.S. Provisional Application No. 61/729,975, filed on Nov. 26, 2012, which is incorporated by reference in its entirety.

GOVERNMENT LICENSE RIGHTS

Certain embodiments disclosed herein were made with partial government support under Grant IIP-1026896, awarded by the U.S. National Science Foundation, and Cooperative Agreement DE-AR0000020, awarded by the U.S. Advanced Research Projects Agency—Energy. The government has certain rights in the invention.

FIELD

This disclosure relates generally to techniques for processing materials for manufacture of gallium-containing nitride substrates. More specifically, embodiments of the disclosure include techniques for growing large area substrates using a combination of processing techniques. The disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photo detectors, integrated circuits, and transistors, and others.

BACKGROUND OF THE DISCLOSURE

Gallium nitride (GaN) based optoelectronic and electronic devices are of tremendous commercial importance. The quality and reliability of these devices, however, is compromised by high defect levels, particularly threading dislocations, grain boundaries, and strain in semiconductor layers of the devices. Threading dislocations can arise from lattice mismatch of GaN based semiconductor layers to a non-GaN substrate such as sapphire or silicon carbide. Grain boundaries can arise from the coalescence fronts of epitaxially-overgrown layers. Additional defects can arise from thermal expansion mismatch, impurities, and tilt boundaries, depending on the details of the growth of the layers.

The presence of defects has a deleterious effect on epitaxially-grown layers. Such effect includes compromising electronic device performance. To overcome these defects, techniques have been proposed that require complex, tedious fabrication processes to reduce the concentration and/or impact of the defects. While a substantial number of conventional growth methods for gallium nitride crystals have been proposed, limitations still exist. That is, conventional methods still merit improvement to be cost effective and efficient.

Progress has been made in the growth of large-area gallium nitride crystals with considerably lower defect levels than heteroepitaxial GaN layers. However, most techniques for growth of large-area GaN substrates involve GaN deposition on a non-GaN substrate such as sapphire or GaAs. This approach generally gives rise to threading dislocations at average concentrations of $10^5$-$10^7$ cm$^{-2}$ over the surface of thick boules, as well as significant bow, stress, and strain. Reduced concentrations of threading dislocations are desirable for a number of applications. Bow, stress, and strain can cause low yields when slicing the boules into wafers, make the wafers susceptible to cracking during down-stream processing, and may also negatively impact device reliability and lifetime. Another consequence of the bow, stress, and strain is that, during growth in m-plane and semipolar directions, even by near-equilibrium techniques such as ammonothermal growth, significant concentrations of stacking faults may be generated. In addition, the quality of c-plane growth may be unsatisfactory, due to formation of cracks, multiple crystallographic domains, and the like. Capability to manufacture substrates larger than 2 inches is currently very limited, as is capability to produce large-area GaN substrates with a nonpolar or semipolar crystallographic orientation. Most large area substrates are manufactured by vapor-phase methods, such as hydride vapor phase epitaxy (HVPE), which are relatively expensive. A less-expensive method is desired, while also achieving large area and low threading dislocation densities as quickly as possible.

Ammonothermal crystal growth has a number of advantages over HVPE as a means for manufacturing GaN boules. However, the performance of ammonothermal GaN crystal growth processing may be significantly dependent on the size and quality of seed crystals. Seed crystals fabricated by HVPE may suffer from many of the limitations described above, and large area ammonothermally-grown crystals are not widely available.

Lateral epitaxial overgrowth is a method that has been widely applied to improvement in the crystallographic quality of films grown by vapor-phase methods. However, no one has yet been able to apply such methods to ammonothermal GaN growth.

From the above, it is seen that techniques for improving crystal growth are highly desirable.

BRIEF SUMMARY OF THE DISCLOSURE

Disclosed herein are techniques for processing materials for manufacture of gallium containing substrates to form a free-standing ammonothermal group III metal nitride crystal. The crystal comprises a group III metal, including at least one of gallium, aluminum, and indium, and nitrogen and has a wurtzite crystal structure. The formed crystal comprises a first large area surface having a maximum dimension greater than about 10 millimeters where the first large-area surface is characterized by a symmetric x-ray rocking curve full width at half maximum less than about 200 arcsec, by an impurity concentration of H greater than about $10^{17}$ cm$^{-3}$, and by an impurity concentration greater than about $10^{15}$ cm$^{-3}$ of at least one of Li, Na, K, F, Cl, Br, and I, as quantified by calibrated secondary ion mass spectrometry. Using the disclosed techniques for lateral epitaxial overgrowth, the aforementioned first large-area surface comprises a pattern of locally-approximately-linear arrays of threading dislocations having a concentration between about 5 cm$^{-1}$ and about $10^5$ cm$^{-1}$, the pattern being characterized by at least one pitch dimension between about 5 micrometers and about 20 millimeters, the regions between the locally-approximately-linear arrays of threading dislocations being characterized by a threading dislocation density below about $10^5$ cm$^{-2}$ and a stacking-fault concentration below about $10^3$ cm$^{-1}$.

According to the present disclosure, further techniques related to techniques for processing materials for manufacture of gallium based substrates are provided. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

A further understanding of the nature and advantages of the present disclosure may be realized by reference to the specification and attached drawings.

DETAILED DESCRIPTION OF THE DISCLOSURE

Figure 1A:
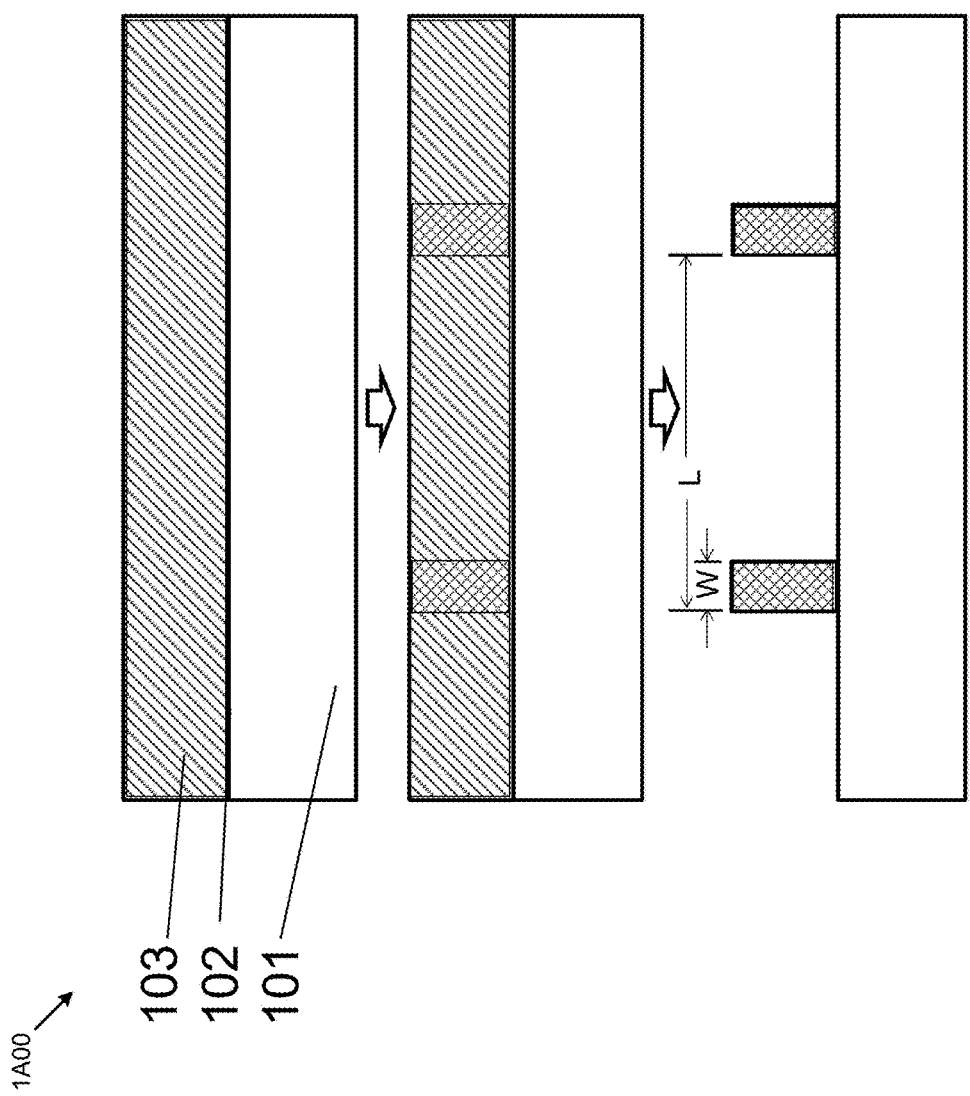
FIG. 1A is a simplified diagram illustrating a method of forming a photoresist pattern on a seed crystal or substrate according to an embodiment of the present disclosure.

According to the present disclosure, techniques related to techniques for processing materials for manufacture of group-III metal nitride and gallium based substrates are provided. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

Threading dislocations in GaN are known to act as strong non-radiative recombination centers which can severely limit the efficiency of GaN-based LEDs and laser diodes. Non-radiative recombination generates local heating which may lead to faster device degradation (Cao et al., *Micro-* electronics *Reliability,* 2003, 43(12), 1987-1991). In high-power applications, GaN-based devices suffer from decreased efficiency with increasing current density, known as droop. There is evidence suggesting a correlation between dislocation density and the magnitude of droop in LEDs (Schubert et al., *Applied Physics Letters,* 2007, 91(23), 231114). For GaN-based laser diodes there is a well-documented negative correlation between dislocation density and mean time to failure (MTTF) (Tomiya et al., *IEEE Journal of Selected Topics in Quantum Electronics,* 2004, 10(6), 1277-1286), which appears to be due to impurity diffusion along the dislocations (Orita et al., *IEEE International Reliability Physics Symposium Proceedings,* 2009, 736-740). For electronic devices, dislocations have been shown to markedly increase the leakage current (Kaun et al., *Applied Physics Express,* 2011, 4(2), 024101) and reduce the device lifetime (Tapajna et al., *Applied Physics Letters,* 2011, 99(22), 223501-223503) in HEMT structures. One of the primary advantages of using bulk GaN as a substrate material for epitaxial thin film growth is a large reduction in the concentration of threading dislocations in the film. Therefore, the dislocation density in the bulk GaN substrate will have a significant impact on the device efficiency and the reliability.

As noted above, lateral epitaxial overgrowth (LEO) is a method that has been widely applied to improvement in the crystallographic quality of films grown by vapor-phase methods. For example, methods whereby GaN layers were nucleated on a sapphire substrate, a $SiO_2$ mask with a periodic array of openings was deposited on the GaN layer, and then GaN was grown by metalorganic chemical vapor deposition (MOCVD) through the openings in the $SiO_2$ mask layer, grew laterally over the mask, and coalesced. The dislocation density in the areas above the openings in the mask were very high, similar to the layer below the mask, but the dislocation density in the laterally-overgrown regions was orders of magnitude less. This method is attractive because it can be applied to large area substrates, significantly reducing their dislocation density. Similar methods, with variations, have been applied by a number of groups to vapor-phase growth of GaN layers. These methods are variously referred to as LEO, epitaxial lateral overgrowth (ELO or ELOG), selective area growth (SAG), and dislocation elimination by epitaxial growth with inverse pyramidal pits (DEEP), or the like. In the case of essentially all variations of this method of which we are aware, a thin heteroepitaxial GaN layer is grown on a non-GaN substrate, a patterned mask is deposited on the GaN layer, and growth is re-initiated in a one- or two-dimensional array of openings in the mask. The period or pitch of the growth locations defined by the openings in the mask is typically between 2 and 100 micrometers, typically between about 5 and 20 micrometers. The individual GaN crystallites or regions grow and then coalesce. Epitaxial growth may then be continued on top of the coalesced GaN material to produce a thick film or "ingot." A relatively thick GaN layer may be deposited on the coalesced GaN material by HVPE. The LEO process is capable of large reductions in the concentration of dislocations, particularly in the regions above the mask, typically to levels of about $10^5$-$10^7$ $cm^{-2}$. However, very often the laterally-grown wings are crystallographically tilted from the underlying substrate ("wing tilt"), by as much as several degrees, which may be acceptable for a thin-film process but may not be acceptable for a bulk crystal growth process, as it may give rise to stresses and cracking as well as unacceptable variation in surface crystallographic orientation.

Several factors make the LEO method difficult to apply to non-vapor-phase growth methods, and therefore non-obvious, and we are not aware of any teaching of the application of such methods to ammonothermal GaN growth. Typically, the masking layer in LEO-type processes comprises $SiO_2$ or $SiN_x$. In a typical ammonothermal growth environment, which is extremely corrosive, both materials are etched and therefore incapable of performing the function of a mask. Finding a material that has good adhesion to GaN, is stable and substantially chemically inert under ammonothermal growth conditions for a growth cycle that may last from several days to about eight weeks, and does not perturb the lateral growth of GaN layers above it, is non-trivial. By contrast, the cycle time of typical MOCVD-based LEO methods are typically at most a few hours, and typical HVPE-based LEO methods have a cycle time less than about a day. In addition, as noted above, these vapor-phase LEO methods have generally used a non-nitride substrate. Unexpected benefits accrue to the herein-disclosed ammonothermal lateral epitaxial overgrowth method, particularly when used together with a gallium-containing nitride substrate.

High quality seed crystals are critical to most true bulk crystal growth processes, and large area seed crystals are particularly useful for a method such as ammonothermal growth. However, most large-area gallium nitride crystals are currently grown by HVPE, as noted above. In addition to the undesirably concentration of threading dislocations typically present in this material, there appears to be a small lattice mismatch between bulk GaN grown by HVPE versus by other, true bulk methods (Darakchieva et al., *Journal of Crystal Growth,* 2008, 310(5), 959-965), on the order of 0.001 Å, corresponding to a strain on the order of $2.5 \times 10^{-4}$. The lattice mismatch between HVPE GaN and ammonothermal GaN may be larger, for example, approximately 0.003 Å, corresponding to a strain on the order of $8 \times 10'$. While these strain levels may sound small, even the smaller value nonetheless corresponds to a Matthews-Blakeslee critical thickness of only about 0.8 micrometer. Above this thickness a bulk-on-HVPE GaN layer structure may reduce its energy by formation of dislocations, if an energetically-accessible mechanism for doing so exists. If energy relaxation by dislocation generation is not possible, in thicker layers relaxation may occur by formation of cracks. Using the Matthews-Klokholm formulation, the critical thickness upon which cracking may occur is 3-10 micrometers for an ammonothermal film grown on HVPE GaN at 550° C., depending on the actual strain. For example, ammonothermal GaN layers on HVPE GaN seed crystals may form cracks for layers thicker than about 0.1 millimeter, about 0.2 millimeter, thicker than about 0.5 millimeter, thicker than about 1 millimeter, thicker than about 2 millimeters, or thicker than about 5 millimeters.

Figure 1B:
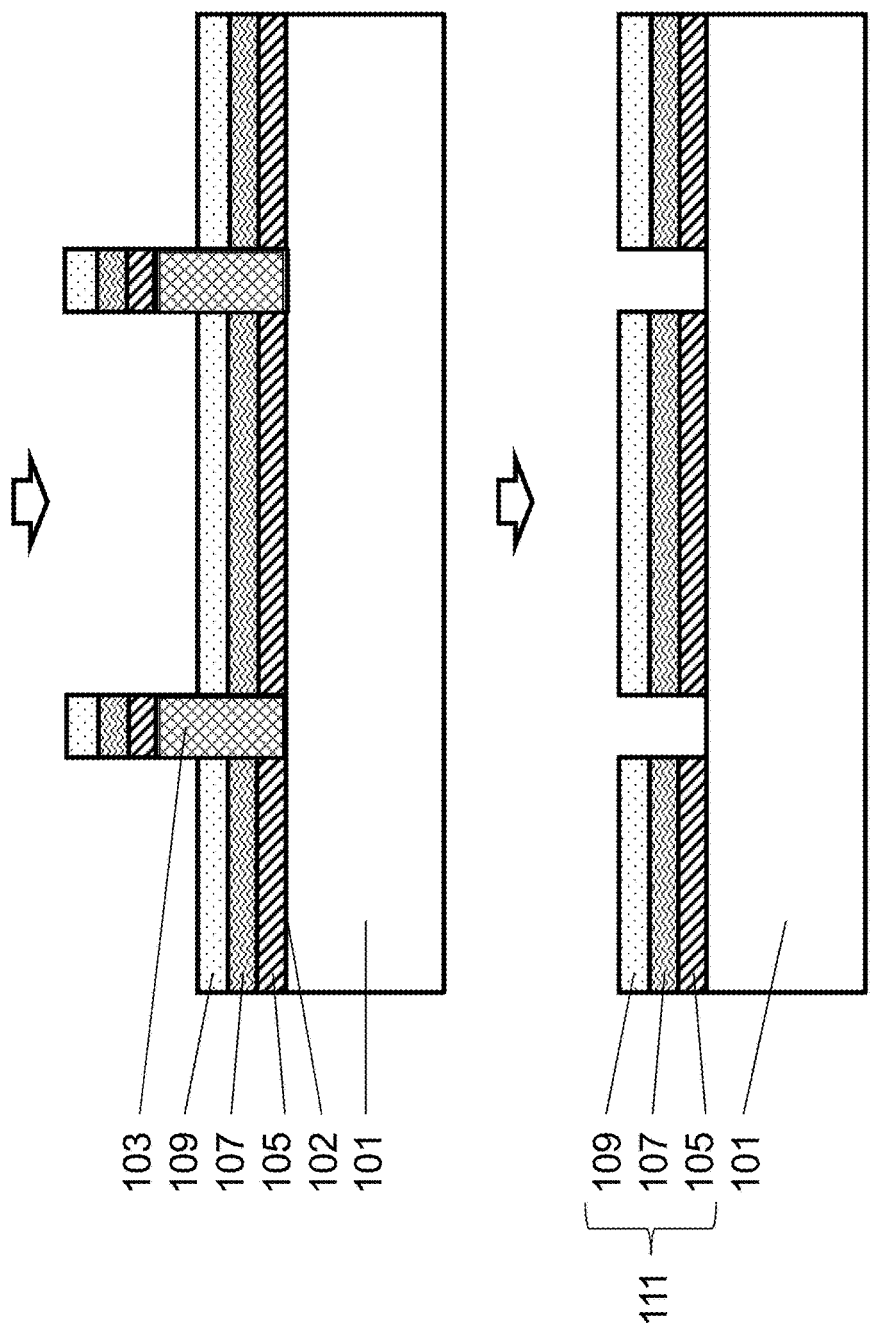
FIG. 1B is a simplified diagram illustrating a method of forming a patterned mask on a seed crystal or substrate according to an embodiment of the present disclosure.
Figure 1C:
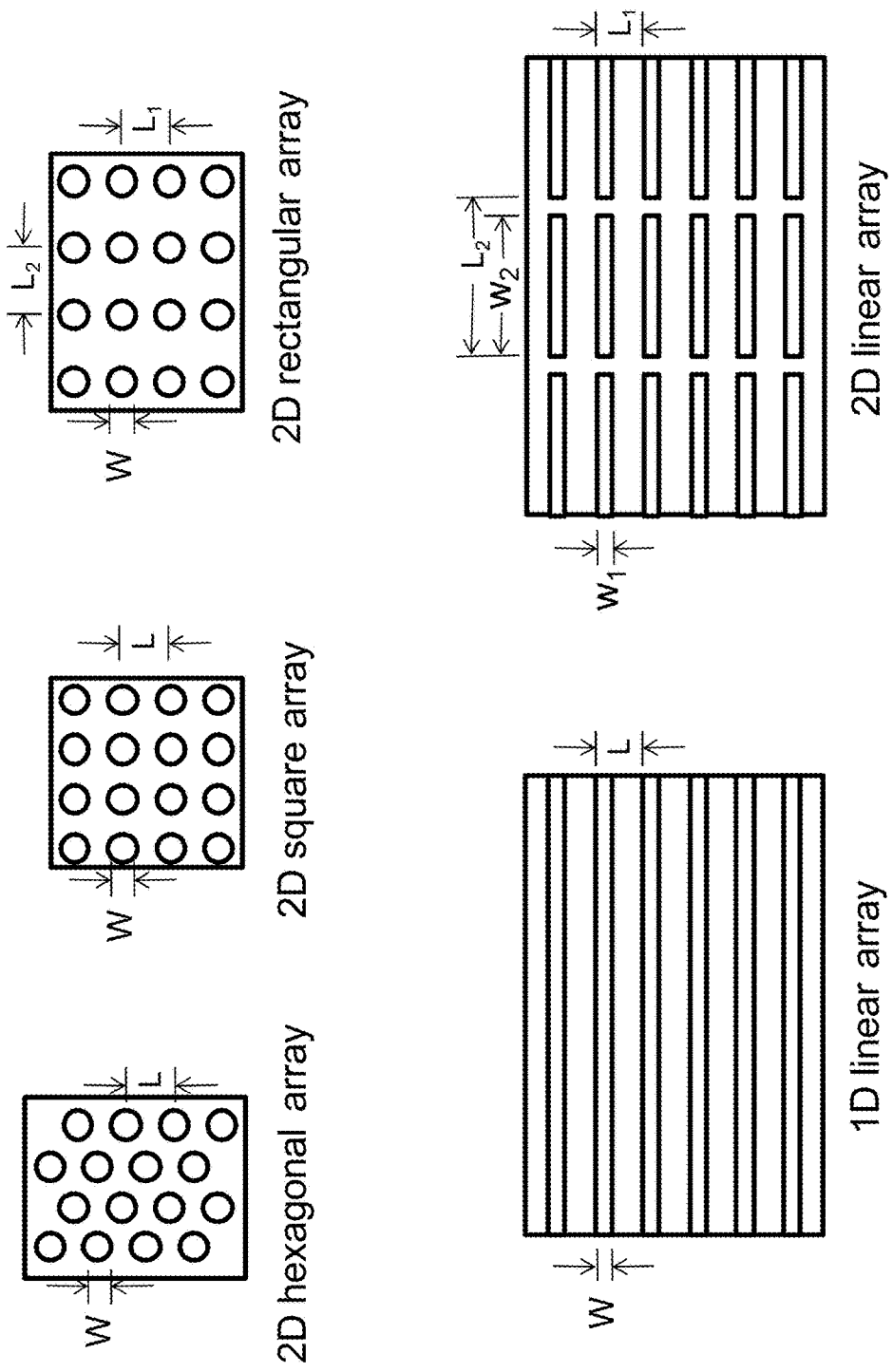
FIG. 1C is a simplified diagram illustrating mask patterns on a seed crystal or substrate according to an embodiment of the present disclosure.

FIGS. 1A, 1B, and 1C depict simplified diagrams 1A00, 1B00, and 1C00 illustrating a method for forming a patterned, masked seed for ammonothermal lateral epitaxial overgrowth. Referring to FIG. 1A, a substrate 101 is provided. In certain embodiments, substrate 101 comprises single-crystalline group-III metal nitride, gallium-containing nitride, or gallium nitride. Substrate 101 may be grown by HVPE, ammonothermally, or by a flux method. One or both large area surfaces of substrate 101 may be polished and/or chemical-mechanically polished. A large-area surface 102 of substrate 101 may have a crystallographic orientation within 5 degrees, within 2 degrees, within 1 degree, or within 0.5 degree of (0001)+c-plane, (000–1)–c-plane, {10–10} m-plane, {11–2±2}, {60–6±1}, {50–5±1}, {40–4±1}, {30-3±1}, {50-5±2}, {70-7±3}, {20-2±1}, {30-3±2}, {40-4±3}, {50-5±4}, {10-1±1}, {1 0 −1 ±2}, {1 0 −1 ±3}, {2 1 −3±1}, or {3 0 −3 ±4}. It will be understood that plane {3 0 −3 ±4} means the {3 0 −3 4} plane and the {3 0 −3 −4} plane. Surface 102 may have an (h k i l) semipolar orientation, where i=−(h+k) and l and at least one of h and k are nonzero. Surface 102 may have a maximum dimension between about 5 millimeters and about 600 millimeters and a minimum dimension between about 1 millimeter and about 600 millimeters and substrate 101 may have a thickness between about 10 micrometers and about 10 millimeters, or between about 100 micrometers and about 2 millimeters.

Substrate 101 may have a surface threading dislocation density less than about $10^7$ cm$^{-2}$, less than about $10^6$ cm$^{-2}$, less than about $10^5$ cm$^{-2}$, less than about $10^4$ cm$^{-2}$, less than about $10^3$ cm$^{-2}$, or less than about $10^2$ cm$^{-2}$. Substrate 101 may have a stacking-fault concentration below about $10^4$ cm$^{-1}$, below about $10^3$ cm$^{-1}$, below about $10^2$ cm$^{-1}$, below about 10 cm$^{-1}$ or below about 1 cm$^{-1}$. Substrate 101 may have a symmetric x-ray rocking curve full width at half maximum (FWHM) less than about 500 arcsec, less than about 300 arcsec, less than about 200 arcsec, less than about 100 arcsec, less than about 50 arcsec, less than about 35 arcsec, less than about 25 arcsec, or less than about 15 arcsec. Substrate 101 may have a crystallographic radius of curvature greater than 0.1 meter, greater than 1 meter, greater than 10 meters, greater than 100 meters, or greater than 1000 meters, in at least one, at least two, or in three independent or orthogonal directions.

Substrate 101 may comprise regions having a relatively high concentration of threading dislocations separated by regions having a relatively low concentration of threading dislocations. The concentration of threading dislocations in the relatively high concentration regions may be greater than about $10^5$ cm$^{-2}$, greater than about $10^6$ cm$^{-2}$, greater than about $10^7$ cm$^{-2}$, or greater than about $10^8$ cm$^{-2}$. The concentration of threading dislocations in the relatively low concentration regions may be less than about $10^6$ cm$^{-2}$, less than about $10^5$ cm$^{-2}$, or less than about $10^4$ cm$^{-2}$. Substrate 101 may comprise regions having a relatively high electrical conductivity separated by regions having a relatively low electrical conductivity. Substrate 101 may have a thickness between about 10 microns and about 100 millimeters, or between about 0.1 millimeter and about 10 millimeters. Substrate 101 may have a dimension, including a diameter, of at least about 5 millimeters, at least about 10 millimeters, at least about 25 millimeters, at least about 50 millimeters, at least about 75 millimeters, at least about 100 millimeters, at least about 150 millimeters, at least about 200 millimeters, at least about 300 millimeters, at least about 400 millimeters, or at least about 600 millimeters.

Surface 102 may have a crystallographic orientation within about 5 degrees of the (0001) Ga-face, c-plane orientation, may have an x-ray diffraction ω-scan rocking curve full-width-at-half-maximum (FWHM) less than about 200 arcsec less than about 100 arcsec, less than about 50 arcsec, or less than about 30 arcsec for the (002) and/or the (102) reflections and may have a dislocation density less than about $10^7$ cm$^{-2}$, less than about $10^6$ cm$^{-2}$, or less than about $10^5$ cm$^{-2}$. In some embodiments, the threading dislocations in surface 102 are approximately uniformly distributed. In other embodiments, the threading dislocations in surface 102 are arranged inhomogenously as a one-dimensional array of rows of relatively high- and relatively low-concentration regions or as a two-dimensional array of high-dislocation-density regions within a matrix of low-dislocation-density regions. The crystallographic orientation of surface 102 may be constant to less than about 5 degrees, less than about 2 degrees, less than about 1 degree, less than about 0.5 degree, less than about 0.2 degree, less than about 0.1 degree, or less than about 0.05 degree.

In alternative embodiments, substrate 101 may comprise sapphire, silicon carbide, gallium arsenide, silicon, germanium, a silicon-germanium alloy, MgAl$_2$O$_4$ spinel, ZnO, ZrB$_2$, BP, InP, AlON, ScAlMgO$_4$, YFeZnO$_4$, MgO, Fe$_2$NiO$_4$, LiGa$_5$O$_8$, Na$_2$MoO$_4$, Na$_2$WO$_4$, In$_2$CdO$_4$, lithium aluminate (LiAlO$_2$), LiGaO$_2$, Ca$_8$La$_2$(PO$_4$)$_6$O$_2$, aluminum nitride (AlN), or the like. In certain embodiments, substrate 101 comprises a group-III metal nitride layer, a gallium-containing nitride layer, or a gallium nitride layer on a non-nitride substrate such as sapphire, silicon carbide, or gallium arsenide. The group-III metal nitride layer, a gallium-containing nitride layer, or a gallium nitride layer may be deposited by HYPE, by metalorganic chemical vapor deposition (MOCVD), molecular beam epitaxy (MBE), or the like. The group III metal nitride layer may have a thickness between about 1 micrometer and about 1 millimeter, or between about 5 micrometers and about 100 micrometers. In certain embodiments, substrate 101 comprises group III metal nitride layers, gallium-containing nitride layers, or gallium nitride layers on both the front and back surfaces of a non-nitride substrate. In certain embodiments, substrate 101 comprises a group III metal nitride layer, a gallium-containing nitride layer, or a gallium nitride layer on a foreign substrate such as sapphire, silicon carbide, gallium arsenide, silicon, germanium, a silicon-germanium alloy, MgAl$_2$O$_4$ spinel, ZnO, ZrB$_2$, BP, InP, AlON, ScAlMgO$_4$, YFeZnO$_4$, MgO, Fe$_2$NiO$_4$, LiGa$_5$O$_8$, Na$_2$MoO$_4$, Na$_2$WO$_4$, In$_2$CdO$_4$, lithium aluminate (LiAlO$_2$), LiGaO$_2$, Ca$_8$La$_2$(PO$_4$)$_6$O$_2$, aluminum nitride (AlN), or the like. In one embodiment, the foreign substrate has a coefficient of thermal expansion similar to that of the group-III metal nitride layer, gallium-containing nitride layer, or gallium nitride layer on the foreign substrate.

Referring to FIG. 1A, a photoresist layer 103 may be deposited on surface 102 by methods that are known in the art. For example, in a certain embodiment of a lift-off process, a liquid solution of a negative photoresist is first applied to surface 102. Substrate 101 is then spun at a high speed (for example, between 1000 to 6000 revolutions per minute for 30 to 60 seconds), resulting in a uniform photoresist layer (layer 103) on the surface of 102. Layer 103 may then be baked (for example, between about 90 and about 120 degrees Celsius) to remove excess photoresist solvent. After baking, the photoresist layer 103 may then be exposed to UV light through a photomask to form a pre-determined pattern of cross-linked photoresist. The patterned photoresist may comprise stripes or dots having characteristic width or diameter W and pitch L. Photoresist layer 103 may then be developed to remove non-cross linked material.

Referring to FIG. 1B, one or more mask layers may be deposited on surface 102 and patterned photoresist 103. An adhesion layer 105 may be deposited. Adhesion layer 105 may comprise one or more of Ti, TiN, TiN$_y$, TiSi$_2$, Ta, TaN$_y$, Al, Ge, Al$_x$Ge$_y$, Cu, Si, Cr, V, Ni, W, TiW$_x$, TiW$_x$N$_y$, or the like and may have a thickness between about 1 nanometer and about 1 micrometer. A diffusion-barrier layer 107 may be deposited. Diffusion-barrier layer 107 may comprise one or more of TiN, TiN$_y$, TiSi$_2$, W, TiW$_x$, TiN$_y$, WN$_y$, TaN$_y$, TiW$_x$N$_y$, TiW$_x$Si$_z$N$_y$, TiC, TiCN, Pd, Rh, Cr, or the like, and have a thickness between about 1 nanometer and about 10 micrometers. An inert layer 109 may be deposited. Inert layer 109 may comprise one or more of Au, Ag, Pt, Pd, Rh, Ru, Ir, Ni, Cr, V, Ti, or Ta and may have a thickness between about 10 nanometers and about 100 micrometers. The one or more mask layers may be deposited by sputter deposition, thermal evaporation, electron-beam evaporation, or the like. After deposition of the patterned masking layer(s) 111, the portion of the layer(s) residing above the patterned photoresist layer 103 (and therefore not in direct contact with the wafer) is then lifted off along with the photoresist layer 103 by methods that are known in the art. In certain embodiments, a relatively thin inert layer, for example, 10 to 500 nanometers thick, is deposited prior to the lift-off process. After performing the lift-off process, an additional, thicker inert layer, for example, 5 to 100 micrometers thick, may be deposited over the already-patterned inert layer by electroplating, electroless deposition, or the like.

Other methods besides the lift-off procedure described above may be used to form the pattern mask layer, including shadow masking, positive resist reactive ion etching, wet chemical etching, ion milling, and nanoimprint lithography, plus variations of the negative resist lift-off procedure described above.

In certain embodiments, patterned mask layer(s) are deposited on both the front and back surfaces of substrate 101.

Figure 1D:
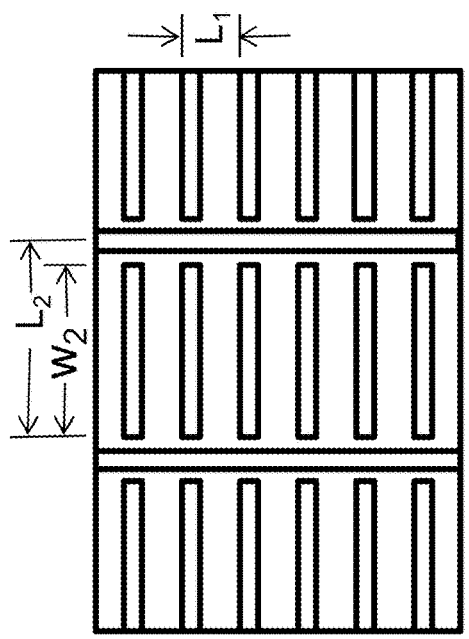
FIG. 1D is a simplified diagram illustrating mask patterns on a seed crystal or substrate according to an embodiment of the present disclosure.
Figure 1D:
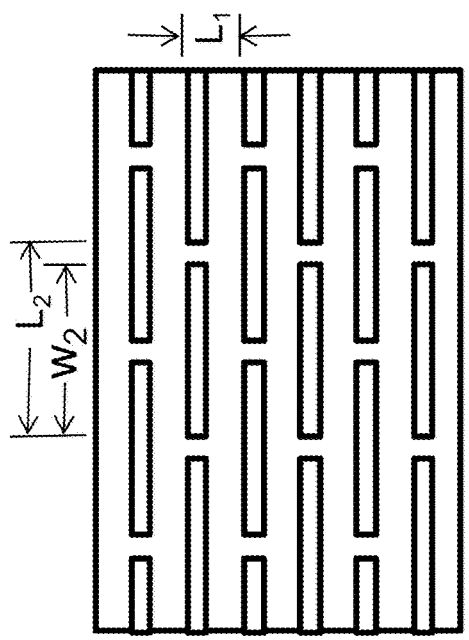

FIG. 1C shows a top view of some possible arrangements of the opening in patterned mask layer(s) 111. In certain embodiments, the openings in patterned mask layer(s) 111 comprise a one-dimensional (1D) array of openings. In certain embodiments, the openings in patterned mask layer(s) 111 comprise a two-dimensional (2D) array of openings. The openings may be round, square, rectangular, triangular, hexagonal, or the like, and may have an opening dimension or diameter W between about 1 micrometer and about 5 millimeters, or between about 10 micrometers and about 500 micrometers. The openings may be arranged in a hexagonal or square array with a pitch dimension L between about 5 micrometers and about 20 millimeters or between about 200 micrometers and about 5 millimeters. The openings may be arranged in a rectangular, parallelogram, hexagonal, or trapezoidal array, in which the pitch dimensions $L_1$ and $L_2$ in two orthogonal directions may be different from one another. The array of openings may also be linear or irregular. The openings in patterned mask layer(s) 111 may be placed in registry with the structure of substrate 101. For example, in certain embodiments, surface 102 is hexagonal, e.g., a (0001) or (000-1) crystallographic orientation, and the openings in patterned mask layer(s) 111 comprise a 2D hexagonal array such that the separations between nearest-neighbor openings are parallel to <11-20> or <10-10> directions in surface 102. In certain embodiments, surface 102 is nonpolar or semipolar and the openings in patterned mask layer(s) 111 comprise a 2D square or rectangular array such that the separations between nearest-neighbor openings are parallel to the projections of two of the c-axis, an m-axis, and an a-axis on surface 102. In certain embodiments, the pattern of openings is obliquely oriented with respect to the structure of substrate 101, for example, wherein the openings in patterned mask layer(s) 111 are rotated by between about 1 degree and about 44 degrees with respect to a high-symmetry axis of the substrate, such as a projection of the c-axis, an m-axis, or an a-axis on surface 102. In certain embodiments, the openings are substantially linear rather than substantially round. In certain embodiments, the openings comprise an array of slits with width W and period L that run across the entire length of substrate 101. In certain embodiments, the slits have a predetermined length $W_2$ that is less than the length of substrate 101, and may be arranged to define a length period $L_2$. Adjacent rows of slits may be offset in the lateral direction from one another rather than arranged directly adjacent, as shown in FIG. 1D. In certain embodiments, the adjacent rows of slits may be offset in the longitudinal direction from one another. The slits may be oriented in more than one direction, as also shown in FIG. 1D.

Patterned substrate 101 may then be suspended on a seed rack and placed in a sealable container, such as a capsule, an autoclave, or a liner within an autoclave. In certain embodiments, one or more pairs of patterned substrates are suspended back to back, with the patterned large area surfaces facing outward. A group III metal source, such as polycrystalline group III metal nitride, at least one mineralizer composition, and ammonia (or other nitrogen containing solvent) are then added to the sealable container and the sealable container is sealed. The mineralizer composition may comprise an alkali metal such as Li, Na, K, Rb, or Cs, an alkaline earth metal, such as Mg, Ca, Sr, or Ba, or an alkali or alkaline earth hydride, amide, imide, amido-imide, nitride, or azide. The mineralizer may comprise an ammonium halide, such as $NH_4F$, $NH_4Cl$, $NH_4Br$, or $NH_4I$, a gallium halide, such as $GaF_3$, $GaCl_3$, $GaBr_3$, $GaI_3$, or any compound that may be formed by reaction of one or more of F, Cl, Br, I, HF, HCl, HBr, HI, Ga, GaN, and $NH_3$. The mineralizer may comprise other alkali, alkaline earth, or ammonium salts, other halides, urea, sulfur or a sulfide salt, or phosphorus or a phosphorus-containing salt. The sealable container may then be placed in a high pressure apparatus, such as an internally heated high pressure apparatus or an autoclave, and the high pressure apparatus sealed.

The sealable container, containing patterned substrate 101, is then heated to a temperature above about 400 degrees Celsius and pressurized above about 50 megapascal to perform ammonothermal crystal growth.

Figure 2:
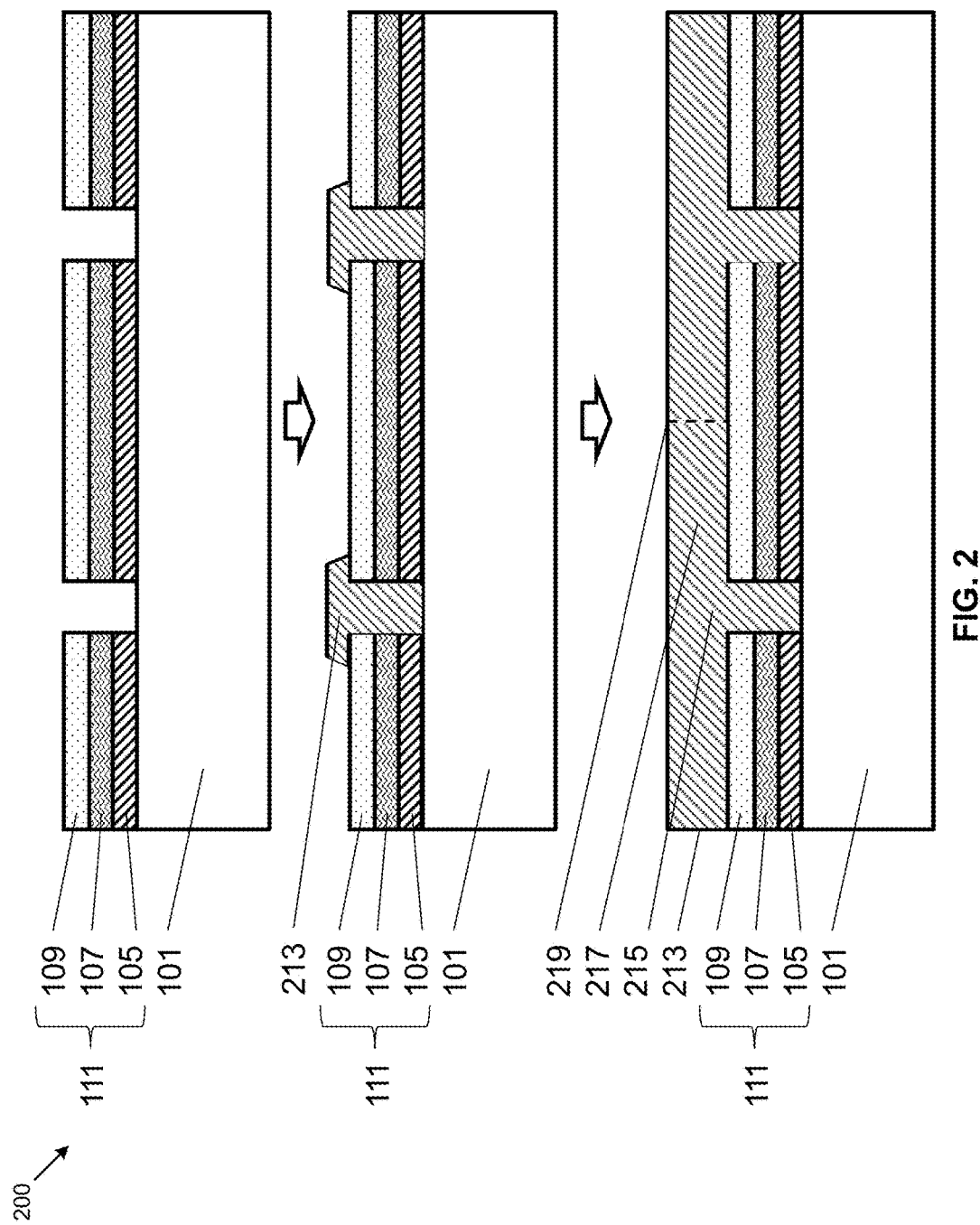
FIG. 2 is a simplified diagram illustrating an epitaxial lateral overgrowth process for forming a large area group III metal nitride crystal according to an embodiment of the present disclosure.

Referring to FIG. 2, during the ammonothermal crystal growth process ammonothermal group III metal nitride material grows within the openings of patterned mask layer 111, grows outward through the openings, grows laterally over patterned mask 111, and coalesces. After coalescence, ammonothermal group III metal nitride layer 213 comprises window regions 215, which have grown vertically with respect to the openings in patterned mask 111, wing regions 217, which have grown laterally over patterned mask layer 111, and coalescence fronts 219, which form at the boundaries between wings growing from adjacent openings in patterned mask layer 111. Ammonothermal group III metal nitride layer 213 may have a thickness between about 10 micrometers and about 100 millimeters, or between about 100 micrometers and about 20 millimeters.

In certain embodiments, ammonothermal group III metal nitride layer 213 is subjected to one or more processes, such as at least one of sawing, lapping, grinding, polishing, chemical-mechanical polishing, or etching.

In certain embodiments, the concentration of extended defects, such as threading dislocations and stacking faults, in the ammonothermal group III metal nitride layer 213 may be quantified by defect selective etching. Defect-selective etching may be performed, for example, using a solution comprising one or more of $H_3PO_4$, $H_3PO_4$ that has been conditioned by prolonged heat treatment to form polyphosphoric acid, and $H_2SO_4$, or a molten flux comprising one or more of NaOH and KOH. Defect-selective etching may be performed at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers, then removing the ammonothermal group III metal nitride layer, crystal, or wafer from the etchant solution.

The concentration of threading dislocations in the surface of the window regions 215 may be similar to that in the underlying seed 101 or less, by as much as approximately four orders of magnitude. The concentration of threading dislocations in the surface of wing regions 217 may be lower, by about one to about three orders of magnitude, than the concentration of threading dislocations in the surface of the window regions 215, and may be below about $10^3$ cm$^{-2}$, below about $10^2$ cm$^{-1}$, or below about 10 cm$^{-2}$. Some stacking faults, for example, at a concentration between about 1 cm$^{-1}$ and about $10^4$ cm$^{-1}$, may be present at the surface of the window regions 215. The concentration of stacking faults in the surface of wing regions 217 may be lower, by about one to about three orders of magnitude, than the concentration of stacking faults in the surface of the window regions 215, and may be below about $10^2$ cm$^{-1}$, below about 10 cm$^{-1}$, below about 1 cm$^{-1}$, or below about 0.1 cm$^{-1}$, or may be undetectable. Threading dislocations, for example, edge dislocations, may be present at coalescence fronts 219, for example, with a line density that is less than about $1\times10^5$ cm$^{-1}$, less than about $3\times10^4$ cm$^{-1}$, less than about $1\times10^4$ cm$^{-1}$, less than about $3\times10^3$ cm$^{-1}$, less than about $1\times10^3$ cm$^{-1}$, less than about $3\times10^2$ cm$^{-1}$, or less than $1\times10^2$ cm$^{-1}$. The density of dislocations along the coalescence fronts may be greater than 5 cm$^{-1}$, greater than 10 cm$^{-1}$, greater than 20 cm$^{-1}$, greater than 50 cm$^{-2}$, greater than 100 cm$^{-1}$, greater than 200 cm$^{-1}$, or greater than 500 cm$^{-1}$.

In certain embodiments, the process of masking and ammonothermal growth is repeated one, two, three, or more times. In some embodiments, as described in further detail below, these operations are performed while the first ammonothermal group III metal nitride layer remains coupled to substrate 101. In other embodiments, substrate 101 is removed prior to a subsequent masking and ammonothermal growth operation, for example, by sawing, lapping, grinding, and/or etching.

Figure 3A:
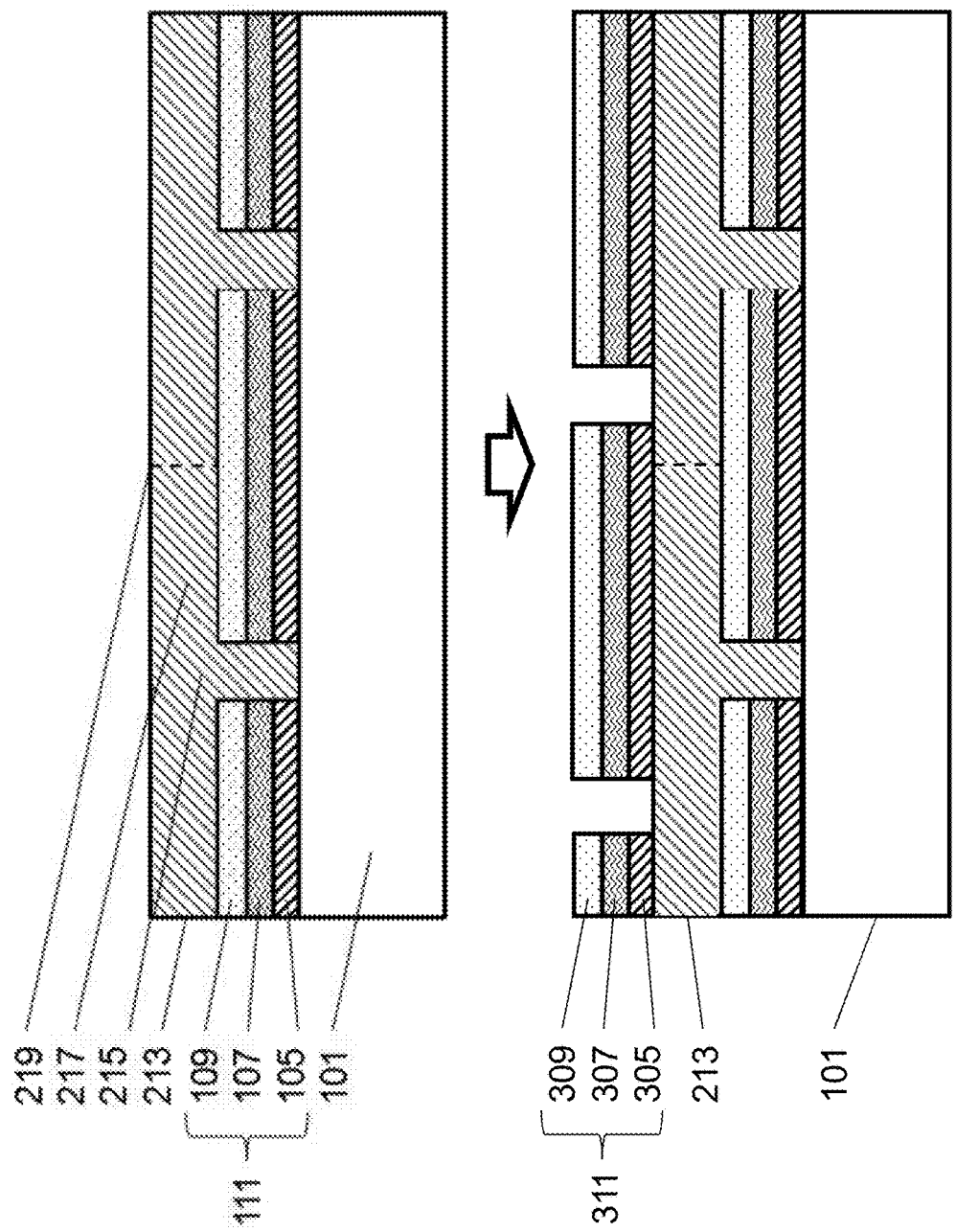
FIG. 3A is a simplified diagram illustrating a method of forming a second patterned mask on a seed crystal or substrate according to an embodiment of the present disclosure.

Referring to FIG. 3A, one or more of second adhesion layer 305, second diffusion-barrier layer 307, and second inert layer 309 may be deposited after depositing and patterning a photoresist layer, and a lift-off operation performed to form openings in second patterned mask layer 311. The openings in second patterned mask layer 311 may be positioned over wing regions 217 rather than over window regions 215 or coalescence fronts 219. In certain embodiments, second patterned mask layer 311 may be approximately parallel to patterned mask layer 111, particularly in the case where the openings in the mask layers comprise slits. In other embodiments, second patterned mask layer 311 may be rotated with respect to patterned mask layer 111, particularly in the case where the openings in the mask layers comprise slits, for example, by approximately 90 degrees, by approximately 30 degrees, or by approximately 60 degrees. In certain embodiments, second patterned mask layer 311 may be a different pattern than that of patterned mask layer 111. For example, patterned mask layer may comprise dot-type openings and second patterned mask layer 311 may comprise slits.

Patterned substrate 101, with first ammonothermal group III nitride layer 213 and second patterned mask layer 311, may then be suspended on a seed rack and placed in a sealable container, such as a capsule, an autoclave, or a liner within an autoclave. In certain embodiments, one or more pairs of patterned substrates are suspended back to back, with the patterned large area surfaces facing outward. A group III metal source, such as polycrystalline group III metal nitride, at least one mineralizer composition, and ammonia (or other nitrogen containing solvent) are then added to the sealable container and the sealable container is sealed. The sealable container may then be placed in a high pressure apparatus, such as an internally heated high pressure apparatus or an autoclave, and the high pressure apparatus sealed.

Figure 3B:
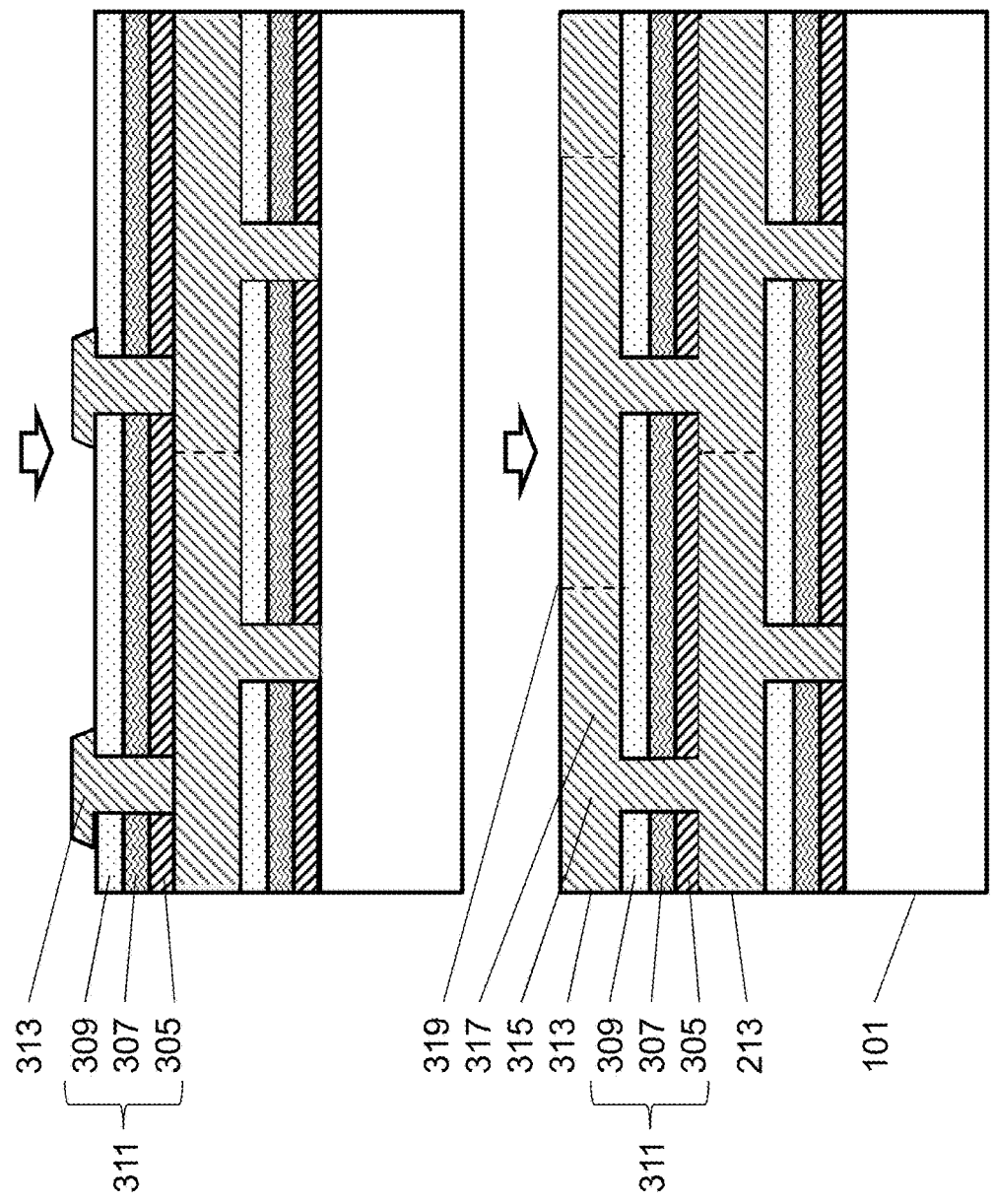
FIG. 3B is a simplified diagram illustrating a second epitaxial lateral overgrowth process for forming a large area group III metal nitride crystal according to an embodiment of the present disclosure.

The sealable container, containing patterned substrate 101, with first ammonothermal group III nitride layer 213 and second patterned mask layer 311, is then heated to a temperature above about 400 degrees Celsius and a pressure above about 50 megapascal (MPa) to perform ammonothermal crystal growth. Referring to FIG. 3B, during the ammonothermal crystal growth process ammonothermal group III metal nitride material 313 grows within the openings of patterned mask 311, grows outward through the openings, grows laterally over second patterned mask layer 311, and coalesces. After coalescence, second ammonothermal group III metal nitride layer 313 comprises second window regions 315, which have grown vertically with respect to the openings in second patterned mask layer 311, second wing regions 317, which have grown laterally over patterned mask 311, and second coalescence fronts 319, which form at the boundaries between wings growing from adjacent openings in second patterned mask layer 311. Second ammonothermal group III metal nitride layer 313 may have a thickness between about 10 micrometers and about 100 millimeters, or between about 100 micrometers and about 20 millimeters.

In certain embodiments, second ammonothermal group III metal nitride layer 313 is subjected to one or more processes, such as at least one of sawing, lapping, grinding, polishing, chemical-mechanical polishing, or etching.

The concentration of threading dislocations in the surface of the second window regions 315 may be similar to that in wing region 217 of first ammonothermal group III metal nitride layer 213 or less, by up to approximately one order of magnitude. The concentration of threading dislocations in the surface of second wing regions 317 may be lower, by up to about one to about three orders of magnitude, than the concentration of threading dislocations in the surface of the second window regions 315, and may be below about $10^3$ cm$^{-2}$, below about $10^2$ cm$^{-1}$, or below about 10 cm$^{-2}$. The concentration of stacking faults in the surface of second ammonothermal group III metal nitride layer 313 may be below about $10^2$ cm$^{-1}$, below about 10 cm$^{-1}$, below about 1 cm$^{-1}$, or below about 0.1 cm$^{-1}$, or may be undetectable. Threading dislocations, for example, edge dislocations, may be present at second coalescence fronts 319, for example, with a line density that is less than about $1\times10^5$ cm$^{-1}$, less than about $3\times10^4$ cm$^{-1}$, less than about $1\times10^4$ cm$^{-1}$, less than about $3\times10^3$ cm$^{-1}$, less than about $1\times10^3$ cm$^{-1}$, less than about $3\times10^2$ cm$^{-1}$, less than about $1\times10^2$ cm$^{-1}$, less than about $3\times10^1$ cm$^{-1}$, less than about $1\times10^1$ cm$^{-1}$, less than about $3\times10^0$ cm$^{-1}$, or less than $1\times10^0$ cm$^{-1}$. The density of dislocations along the coalescence fronts may be greater than about 0.1 cm$^{-1}$, greater than about 0.3 cm$^{-1}$, greater than about 1 cm$^{-1}$, greater than about 3 cm$^{-1}$, greater than about 10 cm$^{-1}$, greater than about 20 cm$^{-1}$, greater than about 50 cm$^{-1}$, greater than about 100 cm$^{-1}$, greater than about 200 cm$^{-1}$, or greater than about 500 cm$^{-1}$.

Figure 4:
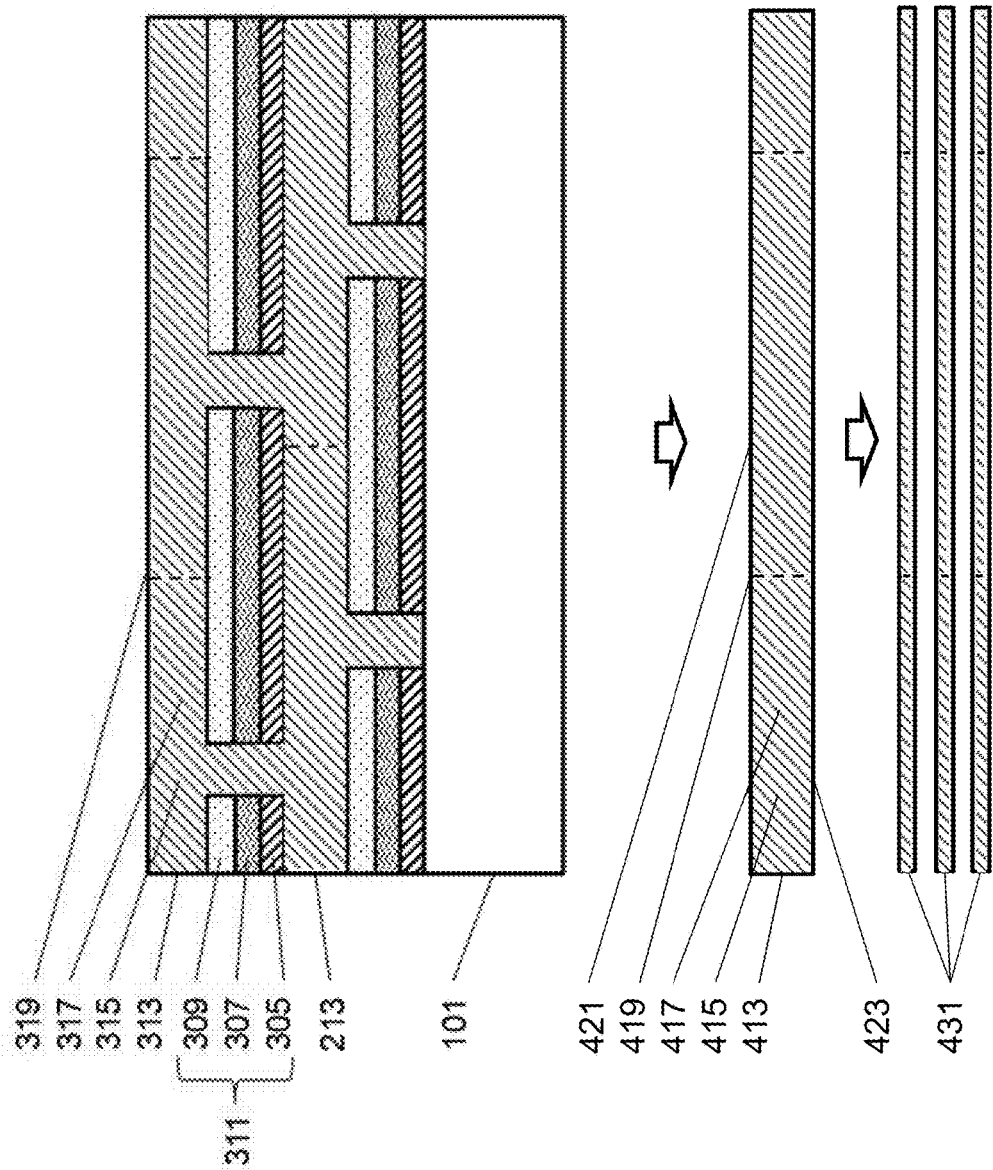
FIG. 4 is a simplified diagram illustrating a method of forming a free-standing ammonothermal group III metal nitride boule and free-standing ammonothermal group III metal nitride wafers.

Referring to FIG. 4, in certain embodiments, substrate 101 is removed from ammonothermal group III metal nitride layer 213, 313, or the last such layer deposited, to a form free-standing ammonothermal group III metal nitride boule 413. Removal of substrate 101 may be accomplished by one or more of sawing, grinding, lapping, polishing, laser lift-off, self-separation, and etching. In certain embodiments, substrate 101 comprises a different composition than the ammonothermal group III metal nitride layer, such as sapphire or gallium arsenide. In such a case, substrate 101 may be removed using process conditions that preferentially etch substrate 101 while producing little or no etching of the ammonothermal group III metal nitride layer. In other embodiments, substrate 101 comprises a similar or essentially identical composition as the ammonothermal group III metal nitride layer and etching is performed under conditions where the etch rate of the back side of substrate 101 is much faster than the etch rate of the front surface of the ammonothermal group III metal nitride layer. In certain embodiments a portion of ammonothermal group III metal nitride layer 213, 313, or the last such layer deposited, may be protected from attack by the etchant by deposition of a mask layer, wrapping the portion of the layer with Teflon, clamping the portion of the layer against Teflon, painting with Teflon paint, or the like. In a specific embodiment, substrate 101 comprises single crystal gallium nitride, surface 102 of substrate 101 has a crystallographic orientation within about 5 degrees of a (0001) crystallographic orientation, and substrate 101 is preferentially etched by heating in a solution comprising one or more of $H_3PO_4$, $H_3PO_4$ that has been conditioned by prolonged heat treatment to form polyphosphoric acid, and $H_2SO_4$ at a temperature between about 150 degrees Celsius and about 500 degrees Celsius for a time between about 30 minutes and about 5 hours, or by heating in a molten flux comprising one or more of NaOH and KOH. Surprisingly, patterned mask layer(s) 111 and 311 may facilitate preferential removal of substrate 101 by acting as an etch stop. Free-standing ammonothermal group III metal nitride boule 413 may comprise one or more window regions 415 that were formed above openings in patterned mask layer(s) 111 or 311, one or more wing regions 417 that were formed above non-open regions in patterned mask layer(s) 111 or 311, and one or more coalescence front regions 419. One or more of front surface 421 and back surface 423 of free-standing ammonothermal group III metal nitride boule 413 may be lapped, polished, etched, and chemical-mechanically polished.

In certain embodiments, the edge of free-standing ammonothermal group III metal nitride boule 413 is ground to form a cylindrically-shaped ammonothermal group III metal nitride boule. In certain embodiments, one or more flats is ground into the side of free-standing ammonothermal group III metal nitride boule 413. In certain embodiments, free-standing ammonothermal group III metal nitride boule 413 is sliced into one or more free-standing ammonothermal group III metal nitride wafers 431. The slicing may be performed by multi-wire sawing, multi-wire slurry sawing, slicing, inner-diameter sawing, outer-diameter sawing, cleaving, ion implantation followed by exfoliation, laser cutting, or the like. One or more large-area surface of free-standing ammonothermal group III metal nitride wafers 431 may be lapped, polished, etched, electrochemically polished, photoelectrochemically polished, reactive-ion-etched, and/or chemical-mechanically polished according to methods that are known in the art. In certain embodiments, a chamfer, bevel, or rounded edge is ground into the edges of free-standing ammonothermal group III metal nitride wafers 431. The free-standing ammonothermal group III metal nitride wafers may have a diameter of at least about 5 millimeters, at least about 10 millimeters, at least about 25 millimeters, at least about 50 millimeters, at least about 75 millimeters, at least about 100 millimeters, at least about 150 millimeters, at least about 200 millimeters, at least about 300 millimeters, at least about 400 millimeters, or at least about 600 millimeters and may have a thickness between about 50 micrometers and about 10 millimeters or between about 150 micrometers and about 1 millimeter. One or more large-area surface of free-standing ammonothermal group III metal nitride wafers 431 may be used as a substrate for group III metal nitride growth by chemical vapor deposition, metalorganic chemical vapor deposition, hydride vapor phase epitaxy, molecular beam epitaxy, flux growth, solution growth, ammonothermal growth, among others, or the like.

Figure 5:
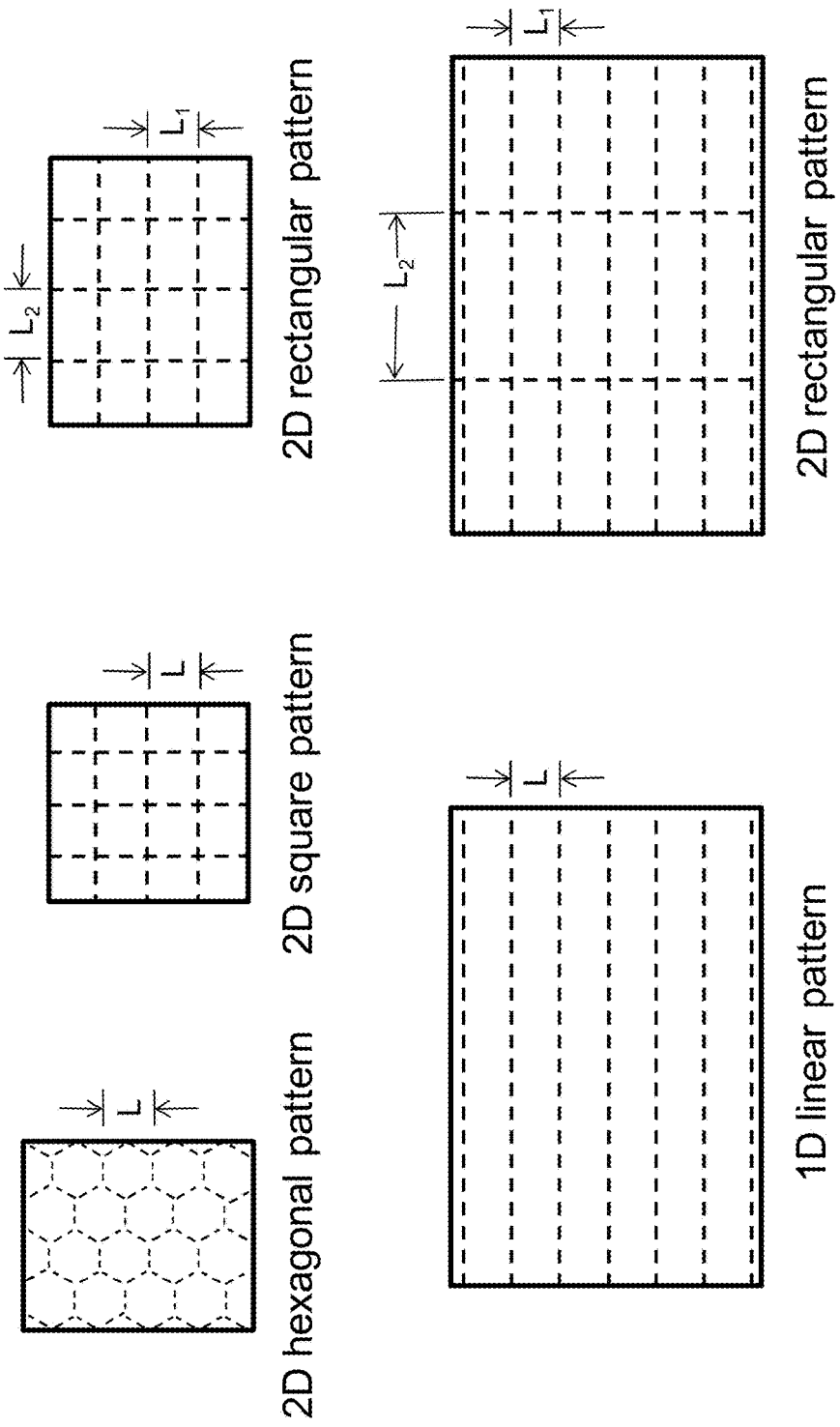
FIG. 5 is a simplified diagram illustrating threading dislocation patterns on a free-standing ammonothermal group III metal nitride boule or wafer according to an embodiment of the present disclosure.

Referring to FIG. 5, the large-area surfaces of the free-standing ammonothermal group III metal nitride boule or wafer may be characterized by a pattern of locally-approximately-linear arrays of threading dislocations that propagated from coalescence fronts formed during the epitaxial lateral overgrowth process. The pattern may be 2D hexagonal, square, rectangular, trapezoidal, triangular, 1D linear, or irregular. More complex patterns are also possible and may be advantageous, for example, in being more resistant to cracking or cleaving. The pattern may be elongated in one direction compared to another orthogonal direction, for example, due to the boule being sliced at an inclined angle relative to the large-area surface of a free-standing ammonothermal group III metal nitride boule. The pattern of locally-approximately-linear arrays of threading dislocations may be characterized by a pitch dimension L, or by pitch dimensions $L_1$ and $L_2$ in two orthogonal directions, between about 5 micrometers and about 20 millimeters or between about 200 micrometers and about 5 millimeters. In certain embodiments, the pattern of locally-approximately-linear arrays of threading dislocations is approximately aligned with the underlying crystal structure of the group III metal nitride, for example, with the locally-approximately-linear arrays lying within about 5 degrees, within about 2 degrees, or within about 1 degree of a crystallographic plane selected from $\{1\ 0\ -1\ 0\}$, $\{1\ 1\ -2\ 0\}$, or $\{0\ 0\ 0\pm1\}$ and a projection of the crystallographic plane on the plane of the surface of the free-standing ammonothermal group III nitride boule or wafer. The linear concentration of threading dislocations in the pattern may be less than about $1\times10^5$ cm−1, less than about $3\times10^4$ cm−1, less than about $1\times10^4$ cm−1, less than about $3\times10^3$ cm−1, less than about $1\times10^3$ cm−1, less than about $3\times10^2$ cm−1, or less than about $1\times10^2$ cm−1. The linear concentration of threading dislocations in the pattern may be greater than 5 cm−1, greater than 10 cm−1, greater than 20 cm−1, greater than 50 cm−1, greater than 100 cm−1, greater than 200 cm−1, or greater than 500 cm−1.

The concentration of threading dislocations in the regions between the locally-approximately-linear arrays of threading dislocations may be below about $10^5$ cm$^{-2}$, below about $10^4$ cm$^{-2}$, below about $10^3$ cm$^{-2}$, below about $10^2$ cm$^{-1}$, or below about 10 cm$^{-2}$. The concentration of threading dislocation, averaged over a large area surface of the free-standing ammonothermal group III nitride boule or wafer, may be below about $10^7$ cm$^{-2}$, below about $10^6$ cm$^{-2}$, below about $10^5$ cm$^{-2}$, below about $10^4$ cm$^{-2}$, below about $10^3$ cm$^{-2}$, or below about $10^2$ cm$^{-1}$. The concentration of stacking faults, averaged over a large area surface of the free-standing ammonothermal group III nitride boule or wafer, may be below about $10^3$ cm$^{-1}$, below about $10^2$ cm$^{-1}$, below about 10 cm$^{-1}$, below about 1 cm$^{-1}$, or below about 0.1 cm$^{-1}$, or may be undetectable. In some embodiments, for example, after repeated re-growth on a seed crystal with a patterned array of dislocations and/or growth to a thickness greater than 2 millimeters, greater than 3 millimeters, greater than 5 millimeters, or greater than 10 millimeters, the positions of the threading dislocations may be displaced laterally to some extent with respect to the pattern on the seed crystal. In such a case the regions with a higher concentration of threading dislocations may be somewhat more diffuse than the relatively sharp lines illustrated schematically in FIG. 5. However, the concentration of threading dislocations as a function of lateral position along a line on the surface will vary periodically, with a period between about 5 micrometers and about 20 millimeters or between about 200 micrometers and about 5 millimeters. The concentration of threading dislocations within the periodically-varying region may vary by at least a factor of two, at least a factor of 5, at least a factor of 10, at least a factor of 30, at least a factor of 100, at least a factor of 300, or at least a factor of 1000.

The free-standing ammonothermal group III metal nitride boule or wafer may have a large-area crystallographic orientation within 5 degrees, within 2 degrees, within 1 degree, within 0.5 degree, within 0.2 degree, within 0.1 degree, within 0.05 degree, within 0.02 degree, or within 0.01 degree of (0001)+c-plane, (000-1)-c-plane, {10-10} m-plane, {1 1 -2 0} a-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 -1±2}, {1 0 -1±3}, {2 1 -3±1}, or {3 0 -3±4}. The free-standing ammonothermal group III metal nitride boule or wafer may have an (h k i l) semipolar large-area surface orientation, where i=−(h+k) and l and at least one of h and k are nonzero.

In certain embodiments, a large-area surface of a free-standing ammonothermal group III metal nitride crystal or wafer has a crystallographic orientation that is miscut from {10-10} m-plane by between about −60 degrees and about +60 degrees toward [0001]+c-direction and by up to about 10 degrees toward an orthogonal <1-210> a-direction. In certain embodiments, a large-area surface of the free-standing ammonothermal group III metal nitride crystal or wafer has a crystallographic orientation that is miscut from {10-10} m-plane by between about −30 degrees and about +30 degrees toward [0001]+c-direction and by up to about 5 degrees toward an orthogonal <1-210> a-direction. In certain embodiments, a large-area surface of the free-standing ammonothermal group III metal nitride crystal or wafer has a crystallographic orientation that is miscut from {10-10} m-plane by between about −5 degrees and about +5 degrees toward [0001]+c-direction and by up to about 1 degree toward an orthogonal <1-210> a-direction. The free-standing ammonothermal group III metal nitride crystal or wafer may have a stacking fault concentration below $10^2$ cm$^{-1}$, below 10 cm$^{-1}$, or below 1 cm$^{-1}$, and a very low dislocation density, below about $10^5$ cm$^{-2}$, below about $10^4$ cm$^{-2}$, below about $10^3$ cm$^{-2}$, below about $10^2$ cm$^{-2}$, or below about 10 cm$^{-2}$ on one or both of the two large area surfaces.

The free-standing ammonothermal group III metal nitride boule or wafer may have a symmetric x-ray rocking curve full width at half maximum (FWHM) less than about 200 arcsec, less than about 100 arcsec, less than about 50 arcsec, less than about 35 arcsec, less than about 25 arcsec, or less than about 15 arcsec. The free-standing ammonothermal group III metal nitride boule or wafer may have a crystallographic radius of curvature greater than 0.1 meter, greater than 1 meter, greater than 10 meters, greater than 100 meters, or greater than 1000 meters, in at least one, at least two, or in three independent or orthogonal directions.

In certain embodiments, at least one surface of the free-standing ammonothermal group III metal nitride boule or wafer has atomic impurity concentrations of at least one of oxygen (O), and hydrogen (H) above about $1\times10^{16}$ cm$^{-3}$, above about $1\times10^{17}$ cm$^{-3}$, or above about $1\times10^{18}$ cm$^{-3}$. In certain embodiments, a ratio of the atomic impurity concentration of H to the atomic impurity concentration of O is between about 1.1 and about 1000, or between about 5 and about 100. In certain embodiments, at least one surface of the free-standing ammonothermal group III metal nitride boule or wafer has impurity concentrations of at least one of lithium (Li), sodium (Na), potassium (K), fluorine (F), chlorine (Cl), bromine (Br), or iodine (I) above about $1\times10^{15}$ cm$^{-3}$, above about $1\times10^{16}$ cm$^{-3}$, or above about $1\times10^{17}$ cm$^{-3}$, above about $1\times10^{18}$ cm$^{-3}$. In certain embodiments, the top and bottom surfaces of the free-standing ammonothermal group III metal nitride boule or wafer may have impurity concentrations of O, H, carbon (C), Na, and K between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, below $1\times10^{16}$ cm$^{-3}$, and below $1\times10^{16}$ cm$^{-3}$, respectively, as quantified by calibrated secondary ion mass spectrometry (SIMS). In another embodiment, the top and bottom surfaces of the free-standing ammonothermal group III metal nitride boule or wafer may have impurity concentrations of O, H, C, and at least one of Na and K between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $3\times10^{15}$ cm$^{-3}$ and $1\times10^{18}$ cm$^{-3}$, respectively, as quantified by calibrated secondary ion mass spectrometry (SIMS). In still another embodiment, the top and bottom surfaces of the free-standing ammonothermal group III metal nitride boule or wafer may have impurity concentrations of O, H, C, and at least one of F and Cl between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $1\times10^{15}$ cm$^{-3}$ and $1\times10^{19}$ cm$^{-3}$, respectively, as quantified by calibrated secondary ion mass spectrometry (SIMS). In some embodiments, the top and bottom surfaces of the free-standing ammonothermal group III metal nitride boule or wafer may have impurity concentrations of H between about $5\times10^{17}$ cm$^{-3}$ and $1\times10^{19}$ cm$^{-3}$, as quantified by calibrated secondary ion mass spectrometry (SIMS). In certain embodiments, at least one surface of the free-standing ammonothermal group III metal nitride boule or wafer has an impurity concentration of copper (Cu), manganese (Mn), and iron (Fe) between about $1\times10^{16}$ cm$^{-3}$ and $1\times10^{19}$ cm$^{-3}$. In a specific embodiment, the free-standing ammonothermal group III metal nitride boule or wafer has an infrared absorption peak at about 3175 cm$^{-1}$, with an absorbance per unit thickness of greater than about 0.01 cm$^{-1}$.

The free-standing ammonothermal group III metal nitride crystal or wafer may be characterized by a wurtzite structure substantially free from any cubic entities or other crystal structures, the other structures being less than about 0.1% in volume in reference to the substantially wurtzite structure.

Surprisingly, given the lattice mismatch between HVPE GaN and ammonothermal GaN, results of use of the herein-disclosed techniques show that ammonothermal lateral epitaxial overgrowth is capable of producing thick, large-area GaN layers that are free of cracks. In certain embodiments, the free-standing ammonothermal group III metal nitride crystal or wafer has a diameter larger than about 25 millimeters, larger than about 50 millimeters, larger than about 75 millimeters, larger than about 100 millimeters, larger than about 150 millimeters, larger than about 200 millimeters, larger than about 300 millimeters, or larger than about 600 millimeters, and a thickness greater than about 0.1 millimeter, greater than about 0.2 millimeter, greater than about 0.3 millimeter, greater than about 0.5 millimeter, greater than about 1 millimeter, greater than about 2 millimeters, greater than about 3 millimeters, greater than about 5 millimeters, greater than about 10 millimeters, or greater than about 20 millimeters, and is substantially free of cracks. By contrast, we find that ammonothermal growth on large-area, un-patterned HVPE GaN seed crystals leads to cracking if the layers are thicker than a few hundred microns, even if a patterning process had been used to form the HVPE GaN seed crystal.

A free-standing ammonothermal group III metal nitride wafer may be characterized by a total thickness variation (TTV) of less than about 25 micrometers, less than about 10 micrometers, less than about 5 micrometers, less than about 2 micrometers, or less than about 1 micrometer, and by a macroscopic bow that is less than about 200 micrometers, less than about 100 micrometers, less than about 50 micrometers, less than about 25 micrometers, or less than about 10 micrometers. A large-area surface of the free-standing ammonothermal group III metal nitride wafer may have a concentration of macro defects, with a diameter or characteristic dimension greater than about 100 micrometers, of less than about 2 $cm^{-2}$, less than about 1 $cm^{-2}$, less than about 0.5 $cm^{-2}$, less than about 0.25 $cm^{-2}$, or less than about 0.1 $cm^{-2}$. The variation in miscut angle across a large-area surface of the free-standing ammonothermal group III metal nitride wafer may be less than about 5 degrees, less than about 2 degrees, less than about 1 degree, less than about 0.5 degree, less than about 0.2 degree, less than about 0.1 degree, less than about 0.05 degree, or less than about 0.025 degree in each of two orthogonal crystallographic directions. The root-mean-square surface roughness of a large-area surface of the free-standing ammonothermal group III metal nitride wafer, as measured over an area of at least 10 µm×10 µm, may be less than about 0.5 nanometer, less than about 0.2 nanometer, less than about 0.15 nanometer, less than about 0.1 nanometer, or less than about 0.10 nanometer. The free-standing ammonothermal group III metal nitride wafer may be characterized by n-type electrical conductivity, with a carrier concentration between about $1 \times 10^{17}$ $cm^{-3}$ and about $3 \times 10^{19}$ $cm^{-3}$ and a carrier mobility greater than about 100 $cm^2$/V-s. In alternative embodiments, the free-standing ammonothermal group III metal nitride wafer is characterized by p-type electrical conductivity, with a carrier concentration between about $1 \times 10^{15}$ $cm^{-3}$ and about $1 \times 10^{19}$ $cm^{-3}$. In still other embodiments, the free-standing ammonothermal group III metal nitride wafer is characterized by semi-insulating electrical behavior, with a room-temperature resistivity greater than about $10^7$ ohm-centimeter, greater than about $10^8$ ohm-centimeter, greater than about $10^9$ ohm-centimeter, greater than about $10^{10}$ ohm-centimeter, or greater than about $10^{11}$ ohm-centimeter. In certain embodiments, the free-standing ammonothermal group III metal nitride wafer is highly transparent, with an optical absorption coefficient at a wavelength of 400 nanometers that is less than about 10 $cm^{-1}$, less than about 5 $cm^{-1}$, less than about 2 $cm^{-1}$, less than about 1 $cm^{-1}$, less than about 0.5 $cm^{-1}$, less than about 0.2 $cm^{-1}$, or less than about 0.1 $cm^{-1}$.

In some embodiments, the free-standing ammonothermal group III metal nitride crystal or wafer is used as a seed crystal for further bulk growth. In one specific embodiment, the further bulk growth comprises ammonothermal bulk crystal growth. In another specific embodiment, the further bulk growth comprises high temperature solution crystal growth, also known as flux crystal growth. In yet another specific embodiment, the further bulk growth comprises HVPE. The further-grown crystal may be sliced, lapped, polished, etched, and/or chemically-mechanically polished into wafers by methods that are known in the art. The surface of the wafers may be characterized by a root-mean-square surface roughness measured over a 10-micrometer by 10-micrometer area that is less than about 1 nanometer or less than about 0.2 nanometers.

A wafer may be incorporated into a semiconductor structure. The semiconductor structure may comprise at least one $Al_xIn_yGa_{(1-x-y)}N$ epitaxial layer, where $0 \leq x, y, x+y \leq 1$. The epitaxial layer may be deposited on the wafer, for example, by metalorganic chemical vapor deposition (MOCVD) or by molecular beam epitaxy (MBE), according to methods that are known in the art. At least a portion of the semiconductor structure may form a portion of a gallium-nitride-based electronic device or optoelectronic device, such as a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and combinations thereof. The gallium-nitride-based electronic device or optoelectronic device may be incorporated into a lamp or a fixture, such as a luminaire. The gallium-nitride-based electronic device or optoelectronic device, after singulation, may have lateral dimensions of at least 0.1 millimeter by 0.1 millimeter. The gallium-nitride-based electronic or optoelectronic device may have a maximum dimension of at least 8 millimeters and, for example, may comprise a laser diode. The gallium-nitride-based electronic or optoelectronic device may be entirely free of dislocations throughout its volume. For example, at a dislocation density of $10^4$ $cm^{-2}$, a substantial fraction of 0.1×0.1 $mm^2$ devices could be expected to be free of dislocations. At a dislocation density of $10^2$ $cm^{-2}$, a substantial fraction of 1×1 $mm^2$ devices could be expected to be free of dislocations. The gallium-nitride-based electronic or optoelectronic device may be entirely free of stacking faults throughout its volume. For example, at a stacking fault density of 1 $cm^{-1}$, a substantial fraction of 10×1 $mm^2$ stripe-shaped devices, such as laser diodes with nonpolar or semipolar large area surfaces and c-plane facets, could be expected to be free of stacking faults.

Figure 6:
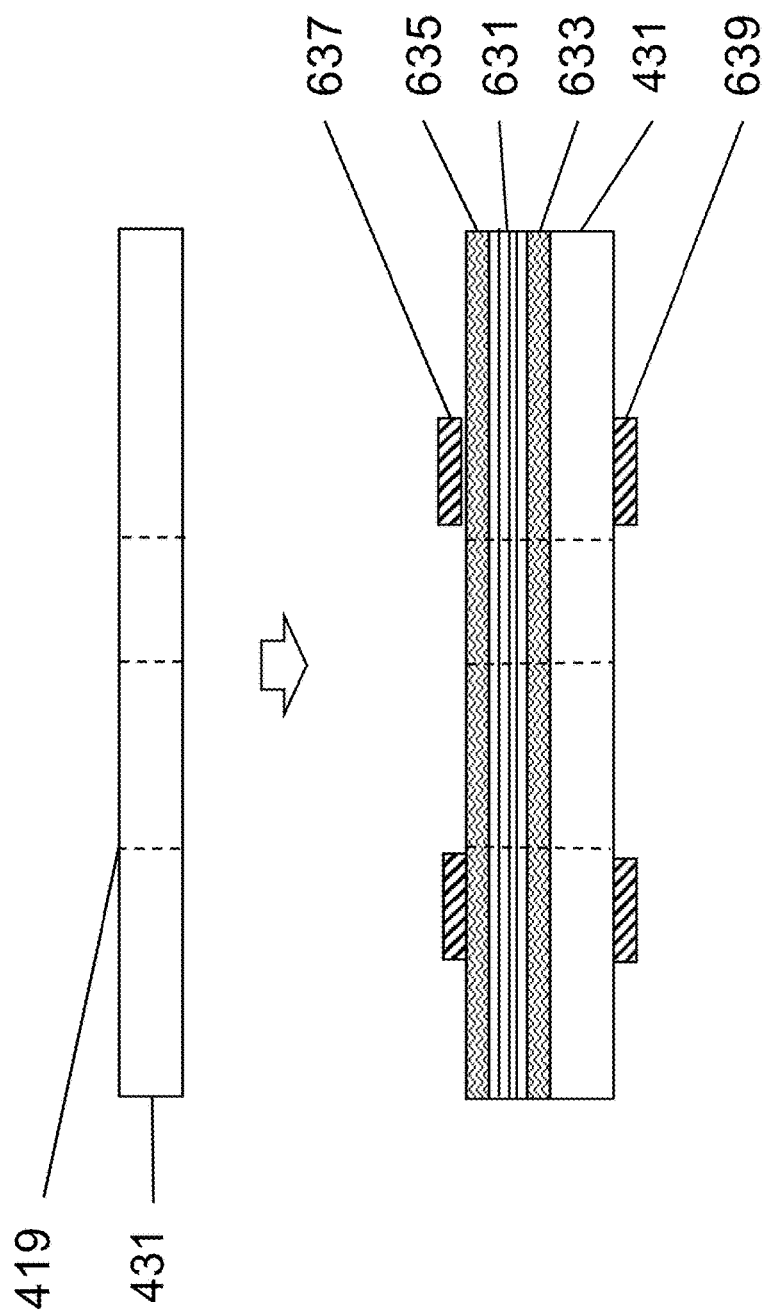
FIGS. 6 and 7 are cross-sectional diagrams illustrating methods and resulting optical devices according to embodiments of the present disclosure.
Figure 7:
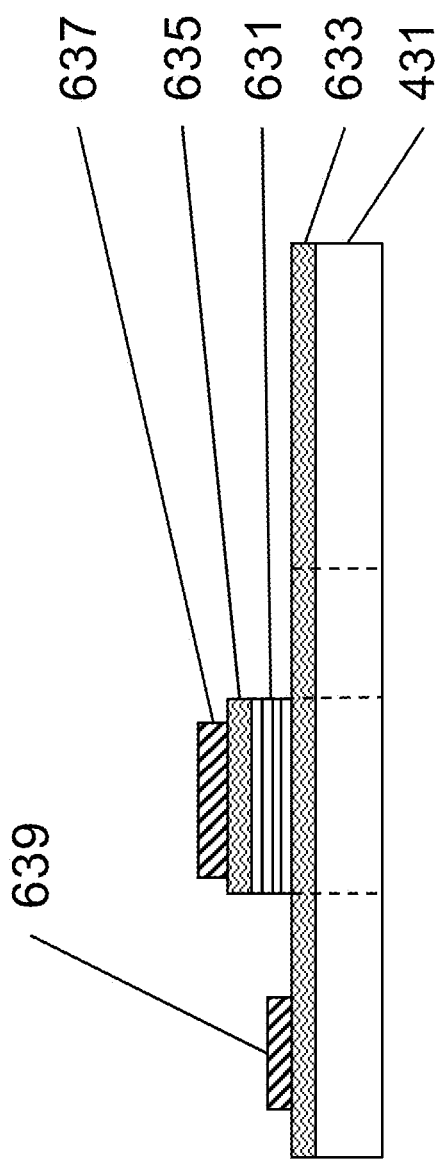

FIGS. 6 and 7 are cross-sectional diagrams illustrating methods and resulting optical devices according to embodiments of the present disclosure. An optical device is formed by a sequence of steps, including the step of epitaxial layer deposition atop an ammonothermal group III metal nitride wafer 431 substrate having one or more coalescence front regions 419 comprising at least one AlInGaN active layer 631, e.g., by MOCVD. In certain embodiments, the deposited layers include an n-type layer 633, a doped or unintentionally doped single quantum well (SQW), a multiple quantum well (MQW) structure or double-heterostructure (DH structure), and a p-type layer 635, as shown. The device structures may be vertical, as illustrated schematically in FIG. 6, or lateral, as illustrated schematically in FIG. 7. The device may be electrically connected to an external circuit to provide a potential between an n-type contact 639 and a p-type contact 637.

In a specific embodiment, the method also deposits an n-type contact 639, and a p-type contact 637. In some embodiments, at least one of the set of n-type and p-type contacts is placed in specific registry respect to the coalescence fronts. The light emission portion may be centered over the coalescence front, or between coalescence fronts. In one specific embodiment, transparent p-type contacts are deposited and are placed in such a way that they avoid contact with coalescence fronts, which may have an elevated concentration of threading dislocations. In this way a light-emitting structure may be formed has a relatively low concentration of threading dislocations. In certain embodiments, a defective region associated with a coalescence front or a window region is utilized as a shunt path for reducing series resistance. In certain embodiments, n-type contacts are placed above coalescence fronts or window regions, with an edge dislocation density above $10^3$ cm$^{-1}$ and/or a threading dislocation density greater than about $10^6$ cm$^{-2}$.

Referring now to FIG. 7, in some embodiments, e.g., a laser diode, the p-contact may be placed in a region substantially free of coalescence fronts. A mesa may be formed by conventional lithography and an n-type contact placed in electrical contact with the n-type layer and/or the substrate.

Figure 8:
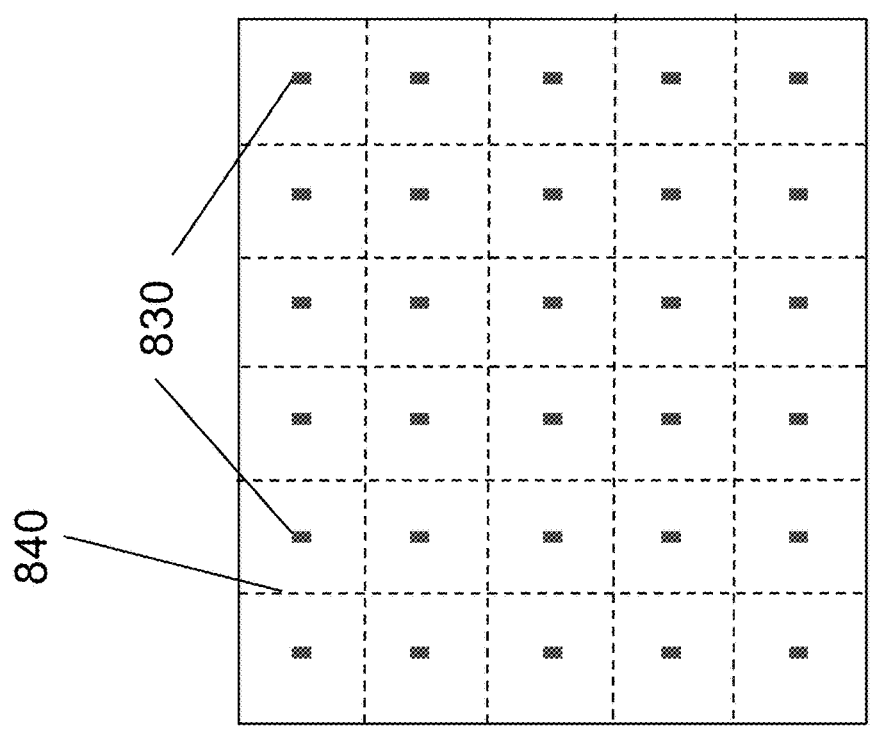
FIG. 8 shows a top view (plan view) of a free-standing GaN substrate formed by ammonothermal lateral epitaxial growth using a mask in the form of a two-dimensional array.

FIG. 8 shows a top view (plan view) of a free-standing GaN substrate formed by ammonothermal lateral epitaxial growth using a mask in the form of a two-dimensional array. The GaN layer grew through the two-dimensional array of openings in the original mask layer to form seed regions 830. Coalescence of the GaN layer may form a two-dimensional grid of coalescence fronts 840 which may comprise, for example, first coalescence fronts 219 or second coalescence fronts 319 or an approximately linear array of dislocations formed by extended or repeated growth from a seed crystal comprising coalescence fronts 219 or 319.

Figure 9A:
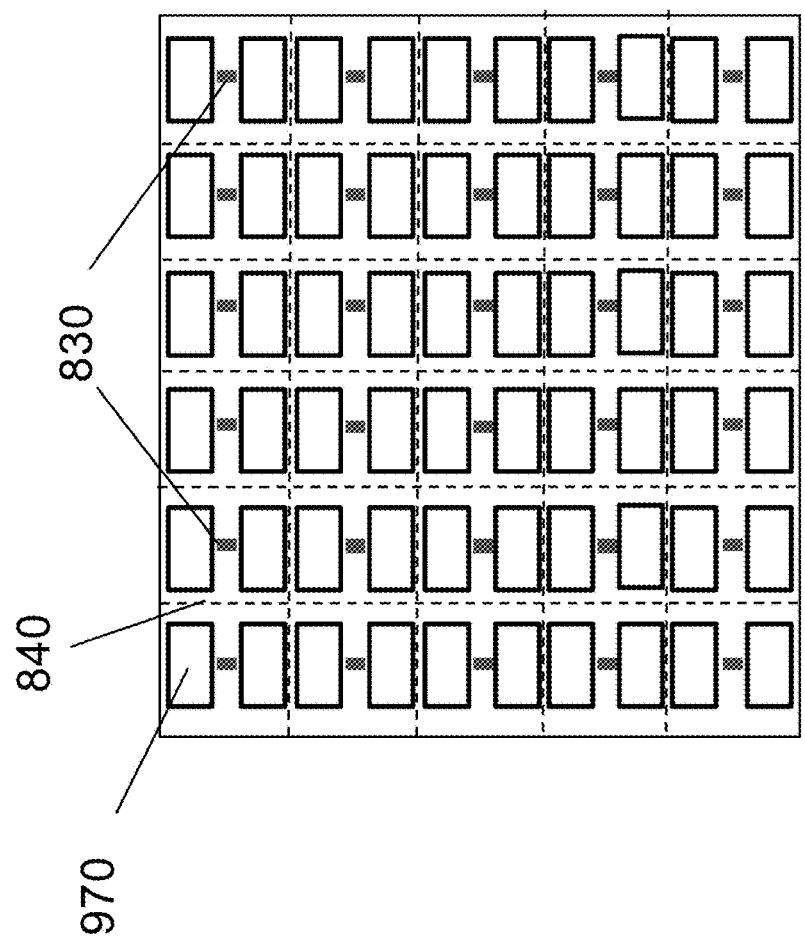
FIG. 9A shows a top view of a device structure, for example, of LEDs, where transparent p-contacts 970 have been aligned with respect and placed so as not to be in contact with either the seed regions 830 or the coalescence fronts 840.
Figure 9B:
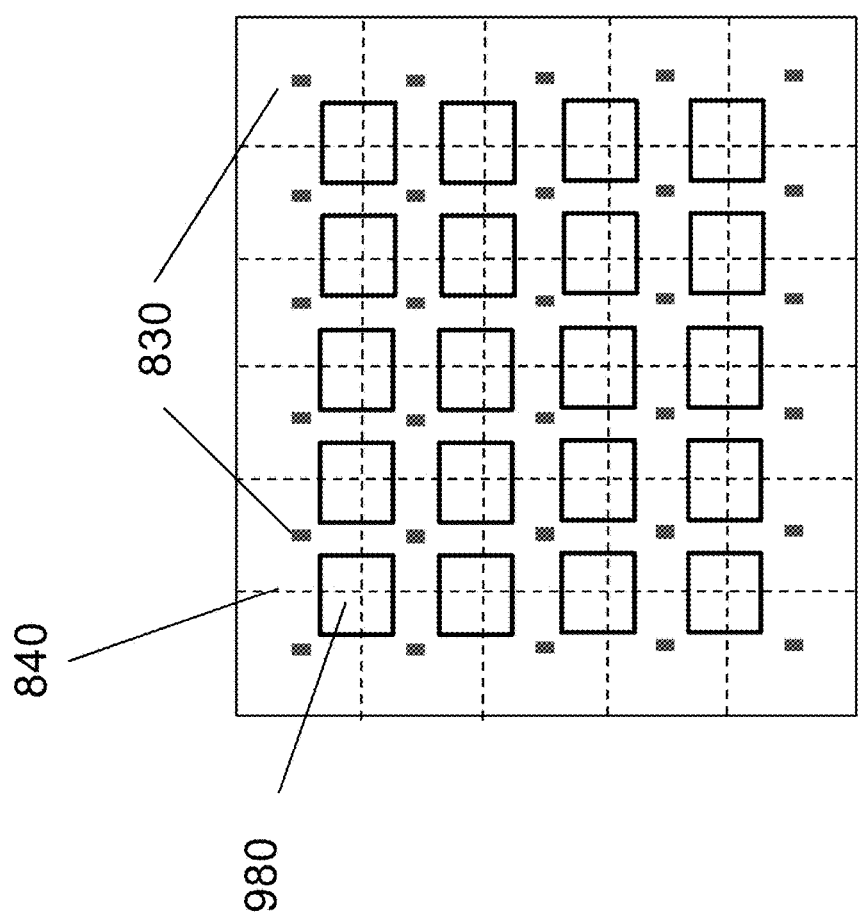
FIG. 9B shows a top view of an alternative embodiment of a device structure, for example, of LEDs, where electrical contacts 980 are again aligned with respect to seed regions 830 and coalescence fronts 840 but now are positioned above coalescence fronts 840.
Figure 9C:
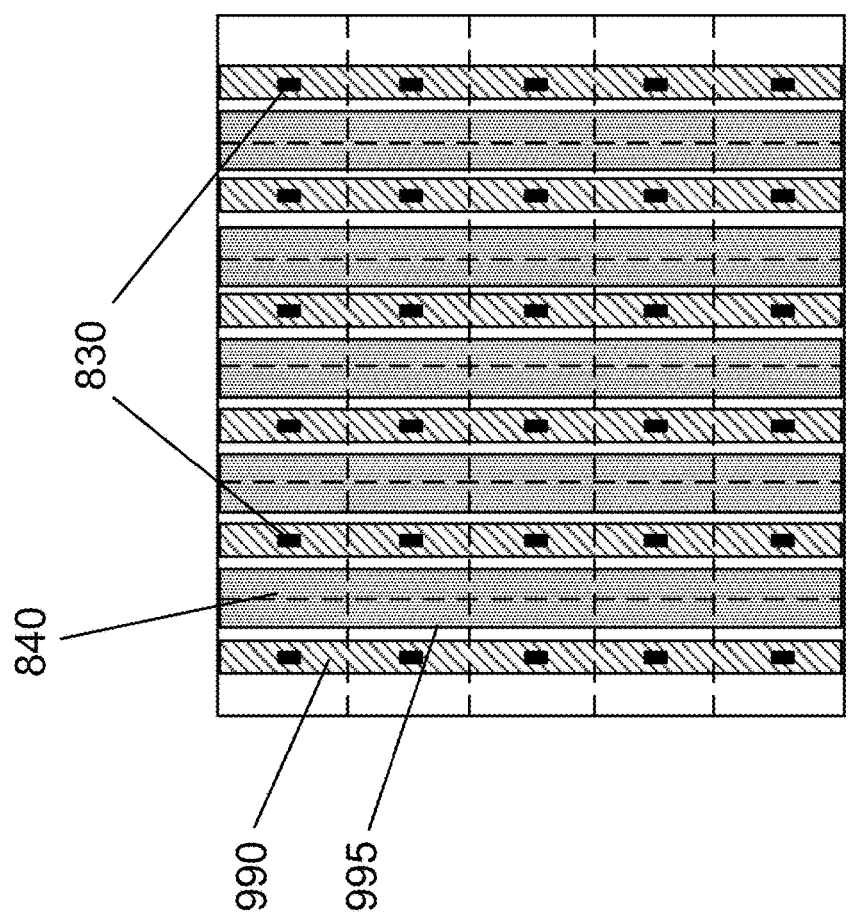
FIG. 9C shows a top view of an alternative embodiment of a device structure, for example, of a flip-chip LED, where n-type electrical contacts 990 are aligned with respect to seed regions 830 and p-type electrical contacts 995 are aligned between seed regions 830.

FIG. 9A shows a top view of a device structure, for example, of LEDs, where transparent p-contacts 970 have been aligned with respect and placed so as not to be in contact with either the seed regions 830 or the coalescence fronts 840. FIG. 9B shows a top view of an alternative embodiment of a device structure, for example, of LEDs, where electrical contacts 980 are again aligned with respect to seed regions 830 and coalescence fronts 840 but now are positioned above coalescence fronts 840. FIG. 9C shows a top view of an alternative embodiment of a device structure, for example, of a flip-chip LED, where n-type electrical contacts 990 are aligned with respect to seed regions 830 and p-type electrical contacts 995 are aligned between seed regions 830.

Individual die, for example, light emitting diodes or laser diodes, may be formed by sawing, cleaving, slicing, singulating, or the like, between adjacent sets of electrical contacts. Referring again to FIG. 9A, slicing may be performed along coalescence fronts 840. Slicing may also be performed through seed regions 830. Referring now to FIG. 9B, in certain embodiments, slicing may be performed through seed regions 830 but not along coalescence fronts 840. Referring again to FIG. 9C, in certain embodiments slicing is performed neither through the seed regions nor along all coalescence fronts. Depending on the arrangement of the one- or two-dimensional array of seed regions, the singulated die may have three corners, four corners, or six corners.

The methods described herein provide means for fabricating large-area group III metal nitride substrates, albeit having some potentially defective regions. The methods described herein provide means for fabricating high-performance light emitting diodes and/or laser diodes that avoid potential issues associated with defective regions in the large-area group III metal nitride substrates.

The above sequence of steps provides a method according to an embodiment of the present disclosure. In a specific embodiment, the present disclosure provides a method and resulting crystalline material provided by a high pressure apparatus having structured support members. Other alternatives can also be provided where steps are added, one or more steps are removed, or one or more steps are provided in a different sequence without departing from the scope of the claims herein.

EXAMPLES

Embodiments provided by the present disclosure are further illustrated by reference to the following examples. It will be apparent to those skilled in the art that many modifications, both to materials, and methods, may be practiced without departing from the scope of the disclosure.

Example 1

A c-plane oriented bulk GaN crystal grown by HYPE, approximately 0.3 millimeters thick, was provided for use as a substrate for patterning. Using nLOF2020 as a photoresist, a pattern comprising linear arrays of 20-micrometer-wide by 1-centimeter-long slits, with a pitch diameter of 520 micrometers was defined. A100-nanometer-thick layer of TiW was deposited as an adhesion layer, followed by a 780-nanometer-thick inert layer comprising Au. A lift-off process was performed and the residual photoresist was removed to obtain a patterned substrate. The mask pattern comprised domains of either m-stripes, with linear openings oriented approximately parallel to <10-10>, or a-stripes, with linear openings oriented approximately parallel to <11-20>. The patterned substrate was placed in a silver capsule along with a 13.4%-open-area baffle, polycrystalline GaN nutrient, NH$_4$F mineralizer, and ammonia, and the capsule was sealed. The ratios of GaN nutrient and NH$_4$F mineralizer to ammonia were approximately 1.02 and 0.048, respectively, by weight. The capsule was placed in an internally-heated high pressure apparatus and heated to temperatures of approximately 650 degrees Celsius for the upper, nutrient zone and approximately 690 degrees Celsius for the lower, crystal growth zone, maintained at these temperatures for approximately 100 hours, and then cooled and removed. Ammonothermal GaN grew through the linear openings in the patterned mask on the HVPE GaN substrate, grew laterally, and coalesced fully, for both the m-stripe and a-stripe patterns, forming an ammonothermal GaN layer approximately 350 micrometers thick with a smooth top surface. The surface of the ammonothermal GaN layer was lightly etched and was examined by optical microscopy and by x-ray rocking-curve analysis.

Figure 10A:
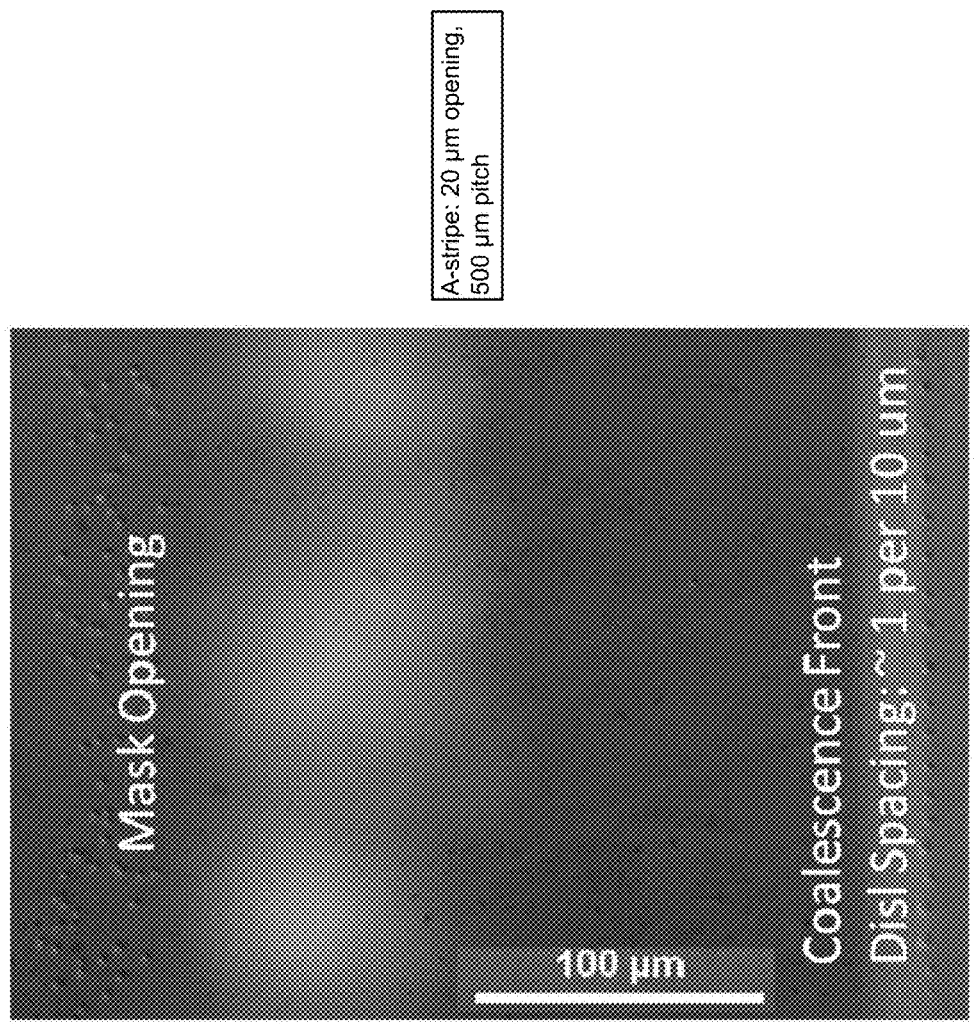
FIG. 10A is an optical micrograph of a c-plane ammonothermal GaN layer that has been subjected to defect-selective etching, showing etch pits in the window region above a slit-shaped mask opening oriented along a <11-20> direction and a linear array of etch pits (threading dislocations) at a concentration of about 100 $cm^{-1}$ at a coalescence front formed approximately midway between two window regions, according to one embodiment.
Figure 10B:
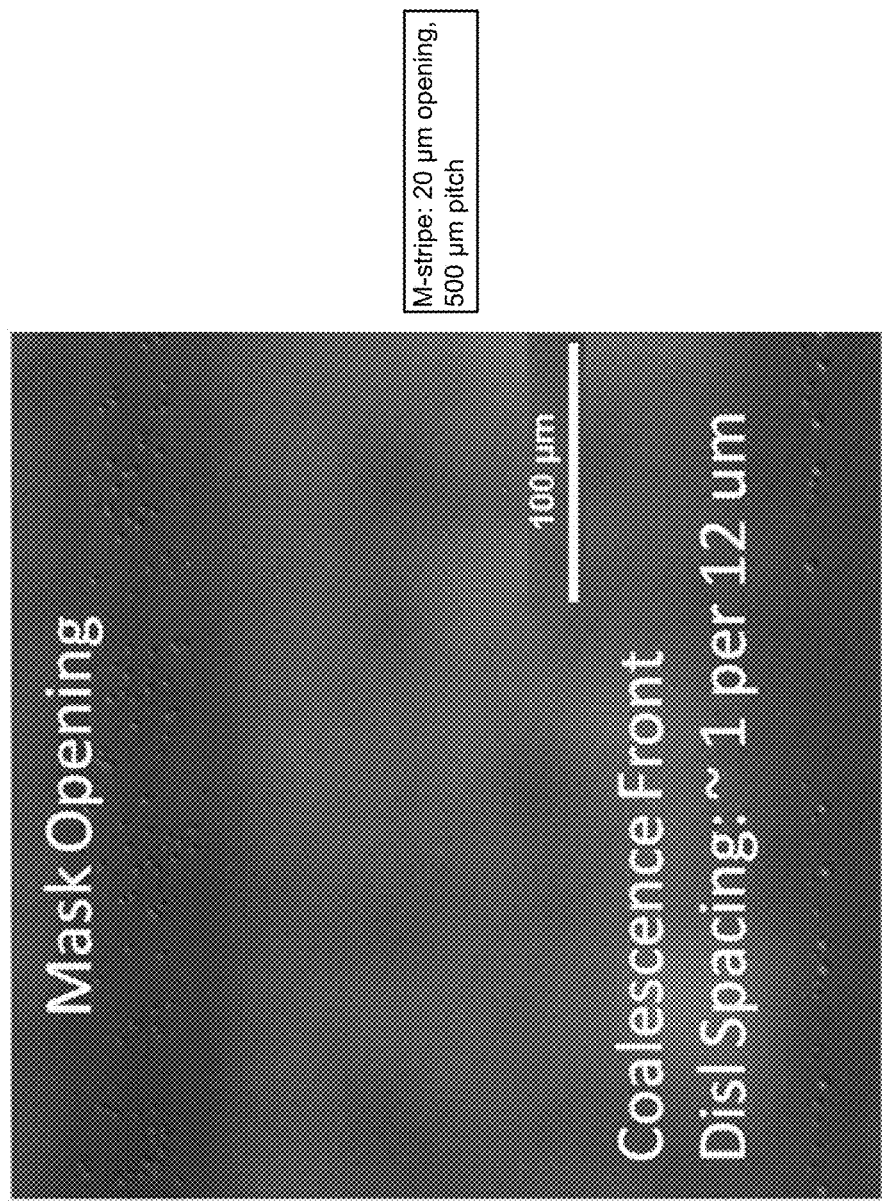
FIG. 10B is an optical micrograph of a c-plane ammonothermal GaN layer that has been subjected to defect-selective etching, showing etch pits in the window region above a slit-shaped mask opening oriented along a <10-10> direction and a linear array of etch pits (threading dislocations) at a concentration of about 83 $cm^{-1}$ at a coalescence front formed approximately midway between two window regions, according to one embodiment.
Figure 12B:
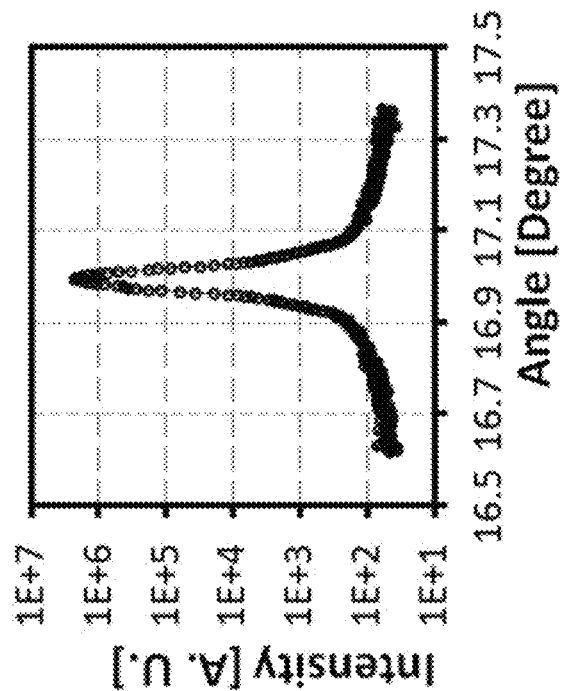
FIG. 12B is a graph showing an x-ray rocking curve measurement of the (002) reflection, rocking about [10-10], of the ammonothermal GaN layer shown in FIG. 11A, showing a narrow, single peak with no evidence for wing tilt, according to one embodiment.
Figure 12A:
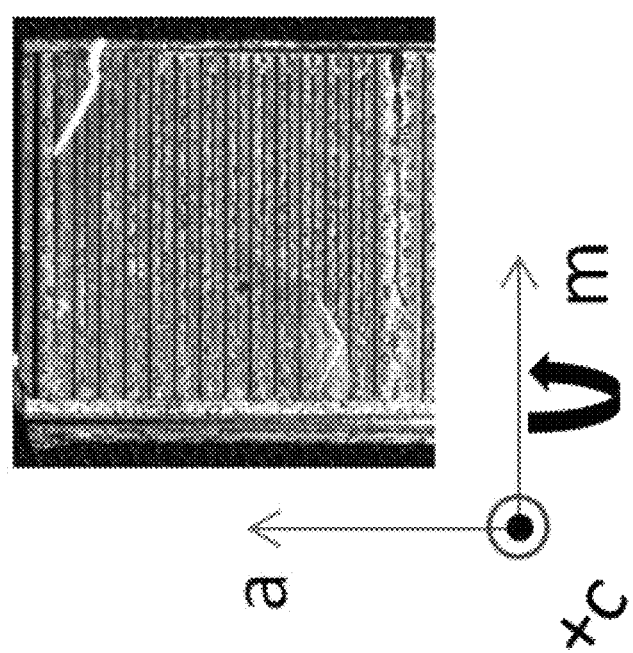
FIG. 12A is a low-power optical micrograph of a domain of an ammonothermal GaN layer, approximately 1 centimeter in dimension, that has been formed by growth through a mask pattern with slit-shaped openings along a [10-10] direction and coalescence, according to one embodiment.

In the case of the m-stripe domain, as shown in FIG. 12A and FIG. 10B, the window region had an etch pit density of approximately $7 \times 10^5$ cm$^{-2}$ and the mask region had an etch pit density of approximately $6 \times 10^3$ cm$^{-2}$, providing for an overall etch pit density of approximately $1 \times 10^5$ cm$^{-2}$. The coalescence fronts were manifested as an approximately linear array of threading dislocations (etch pits), with a linear concentration of approximately 83 cm$^{-1}$. The x-ray diffraction rocking-curve (XRC) behavior was as follows: the (002) reflection, rocking about the a-axis, had a fullwidth-at-half-maximum (FWHM) of 51.6 arcsec, as shown in FIG. 12B, the (002) reflection, rocking about the m-axis, had a FWHM of 71.0 arcsec, and the (201) reflection had a FWHM of 36.9 arcsec.

Figure 11B:
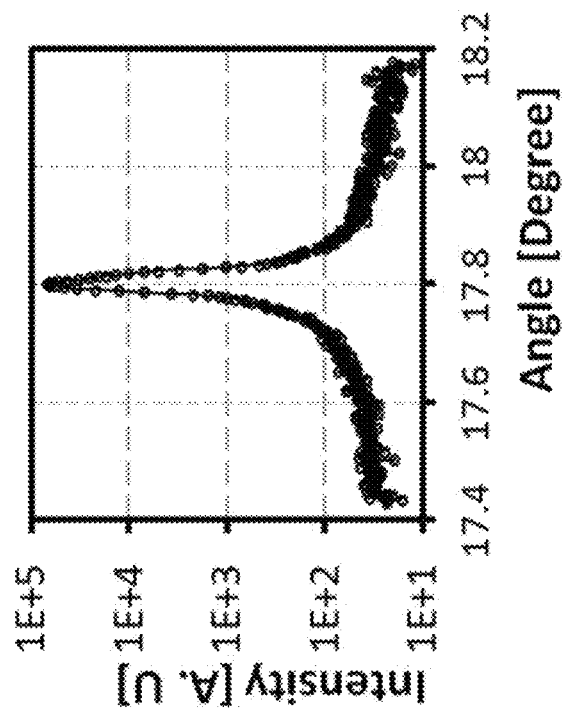
FIG. 11B is a graph showing an x-ray rocking curve measurement of the (002) reflection, rocking about [11-20], of the ammonothermal GaN layer shown in FIG. 11A, showing a narrow, single peak with no evidence for wing tilt, according to one embodiment.
Figure 11A:
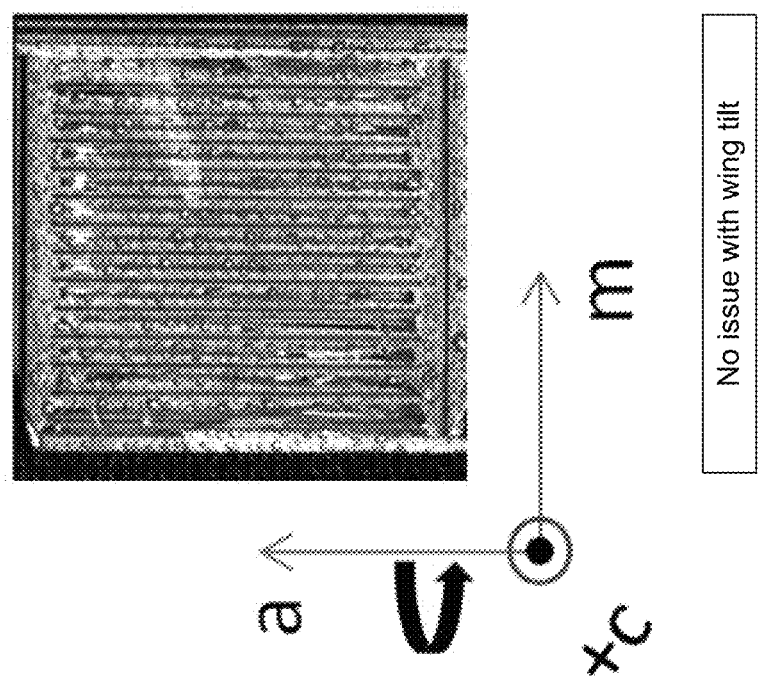
FIG. 11A is a low-power optical micrograph of a domain of an ammonothermal GaN layer, approximately 1 centimeter in dimension, that has been formed by growth through a mask pattern with slit-shaped openings along a [11-20] direction and coalescence, according to one embodiment.

In the case of the a-stripe domain, as shown in FIG. 11A and FIG. 10A, the window region had an etch pit density of approximately $6 \times 10^5$ cm$^{-2}$ and the mask region had an etch pit density of approximately $4 \times 10^3$ cm$^{-2}$, providing for an overall etch pit density of approximately $8 \times 10^4$ cm$^{-2}$. The coalescence fronts were manifested as an approximately linear array of threading dislocations (etch pits), with a linear concentration of approximately 100 cm$^{-1}$. The x-ray diffraction rocking-curve behavior was as follows: the symmetric (002) reflection, rocking about the a-axis, had a full-width-at-half-maximum (FWHM) of 56.7 arcsec, the (002) reflection, rocking about the m-axis, had a FWHM of 74.0 arcsec, as shown in FIG. 11B, and the (201) reflection had a FWHM of 56.6 arcsec.

The narrowness of the XRC FWHM values indicates that wing tilt, which is often severe with LEO structures grown by vapor phase methods, with up to several degrees of tilt, is surprisingly extremely small for this ammonothermal lateral epitaxial overgrowth process.

Example 2

A c-plane oriented bulk GaN crystal grown by HVPE, approximately 0.3 millimeters thick, was provided for use as a substrate for patterning. Using nLOF2020 as a photoresist, a pattern comprising linear arrays of 20-micrometer-wide by the width of the substrate, with a pitch diameter of 1020 micrometers was defined. A 100-nanometer-thick layer of TiW was deposited as an adhesion layer, followed by a 780-nanometer-thick inert layer comprising Au. A lift-off process was performed and the residual photoresist was removed to obtain a patterned substrate. The mask pattern comprised domains of m-stripes, with linear openings oriented approximately parallel to <10-10>. The patterned substrate was placed in a silver capsule along with a 13.4%-open-area baffle, polycrystalline GaN nutrient, NH$_4$F mineralizer, and ammonia, and the capsule was sealed. The ratios of GaN nutrient and NH$_4$F mineralizer to ammonia were approximately 0.96 and 0.048, respectively, by weight. The capsule was placed in an internally-heated high pressure apparatus and heated to a temperature of approximately 650 degrees Celsius for the upper, nutrient zone and approximately 690 degrees Celsius for the lower, crystal growth zone, maintained at these temperatures for approximately 116 hours, and then cooled and removed. Ammonothermal GaN grew through the linear openings in the patterned mask on the HVPE GaN substrate, grew laterally, and coalesced fully, forming an ammonothermal GaN layer approximately 580 micrometers thick with a smooth top surface. The surface of the ammonothermal GaN layer was lightly etched and examined by optical microscopy.

The window region in the ammonothermal GaN layer had an etch pit density of approximately $9.5 \times 10^5$ cm$^{-2}$ and the mask region had an etch pit density of approximately $1 \times 10^4$ cm$^{-2}$, providing for an overall etch pit density of approximately $2 \times 10^5$ cm$^{-2}$. The coalescence fronts were manifested as an approximately linear array of threading dislocations (etch pits), with a linear concentration of approximately 250 cm$^{-1}$.

Example 3

Two m-plane oriented bulk GaN crystals grown by HVPE, approximately 0.3 millimeters thick, were provided for use as substrates for patterning. Using nLOF2020 as a photoresist, a pattern comprising linear arrays of 20-micrometer-wide by the width of the substrate, with a pitch diameter of 550 micrometers was defined. A 100-nanometer-thick layer of TiW was deposited as an adhesion layer, followed by a 780-nanometer-thick inert layer comprising Au. A lift-off process was performed and the residual photoresist was removed to obtain patterned substrates. On the first m-plane substrate the mask pattern comprised domains of c-stripes, with linear openings oriented approximately parallel to <0001>. On the second m-plane substrate the mask pattern comprised domains of a-stripes, with linear openings oriented approximately parallel to <11-20>. The patterned substrates were placed in a silver capsule along with a 13.4%-open-area baffle, polycrystalline GaN nutrient, NH$_4$F mineralizer, and ammonia, and the capsule was sealed. The ratios of GaN nutrient and NH$_4$F mineralizer to ammonia were approximately 0.85 and 0.043, respectively, by weight. The capsule was placed in an internally-heated high pressure apparatus and heated to a temperature of approximately 652 degrees Celsius for the upper, nutrient zone and approximately 681 degrees Celsius for the lower, crystal growth zone, maintained at these temperatures for approximately 88 hours, and then cooled and removed. Ammonothermal GaN grew through the linear openings in the patterned mask on the HVPE GaN substrates, grew laterally, and coalesced fully, for both the c-stripe and a-stripe patterns, forming an ammonothermal GaN layer approximately 234 or 174 micrometers thick, respectively, with a smooth top surface. The surface of the ammonothermal GaN layers were lightly etched and examined by optical microscopy.

In the case of the c-stripe patterned substrate, the window region in the ammonothermal GaN layer had an etch pit density of approximately $1 \times 10^5$ cm$^{-2}$ and the mask region had an etch pit density of approximately $5 \times 10^2$ cm$^{-2}$, providing for an overall etch pit density of approximately $1 \times 10^4$ cm$^{-2}$. In the case of the a-stripe patterned substrate, the stacking fault density was significantly reduced in the laterally grown region above the mask relative to the region above the window, providing for an overall stacking fault concentration of approximately $4 \times 10^2$ cm$^{-1}$.

Example 4

A c-plane oriented bulk GaN crystal grown by HVPE, approximately 0.3 millimeters thick, was provided for use as a substrate for patterning. Using nLOF2020 as a photoresist, a pattern comprising linear arrays of 20-micrometer-wide by the width of the substrate, with a pitch diameter of 1020 micrometers was defined. A 100-nanometer-thick layer of TiW was deposited as an adhesion layer, followed by a 780-nanometer-thick inert layer comprising Au. A lift-off process was performed and the residual photoresist was removed to obtain a patterned substrate. The mask pattern comprised domains of m-stripes, with linear openings oriented approximately parallel to <10-10>. The patterned substrate was placed in a silver capsule along with a 13.4%-open-area baffle, polycrystalline GaN nutrient, NH$_4$F mineralizer, and ammonia, and the capsule was sealed. The ratios of GaN nutrient and NH$_4$F mineralizer to ammonia were approximately 2.18 and 0.090, respectively, by weight. The capsule was placed in an internally-heated high pressure apparatus and heated to a temperature of approximately 648 degrees Celsius for the upper, nutrient zone and approximately 685 degrees Celsius for the lower, crystal growth zone, maintained at these temperatures for approximately 110 hours, and then cooled and removed. Ammonothermal GaN grew through the linear openings in the patterned mask on the HVPE GaN substrate, grew laterally, and coalesced fully, forming an ammonothermal GaN layer approximately 270 micrometers thick with a smooth top surface.

The top surface ammonothermal layer was then patterned a second time by a similar procedure, except that the pattern was translated laterally so that the window regions in the second pattern were positioned above a laterally-grown region in the laterally-grown ammonothermal layer. The mask pattern again comprised domains of m-stripes, with linear openings oriented approximately parallel to <10-10>. The re-patterned substrate was placed in a silver capsule along with a 13.4%-open-area baffle, polycrystalline GaN nutrient, $NH_4F$ mineralizer, and ammonia, and the capsule was sealed. The ratios of GaN nutrient and $NH_4F$ mineralizer to ammonia were approximately 2.16 and 0.089, respectively, by weight. The capsule was placed in an internally-heated high pressure apparatus and heated to a temperature of approximately 649 degrees Celsius for the upper, nutrient zone and approximately 682 degrees Celsius for the lower, crystal growth zone, maintained at these temperatures for approximately 100 hours, and then cooled and removed. Ammonothermal GaN grew through the linear openings in the patterned mask on the HVPE GaN substrate, grew laterally, and coalesced fully, forming a second ammonothermal GaN layer approximately 180 micrometers thick with a smooth top surface. The surface of the ammonothermal GaN layer was lightly etched and examined by optical microscopy. Virtually the only dislocations that were present were located at coalescence fronts, with a line density of approximately $1.5 \times 10^3$ cm$^{-1}$, corresponding to an average dislocation density of approximately $1.5 \times 10^4$ cm$^{-2}$.

Example 5

A 2-inch diameter, c-plane oriented bulk GaN crystal grown by HVPE, approximately 0.3 millimeters thick, was provided for use as a substrate for patterning. Using nLOF2020 as a photoresist, a pattern comprising linear arrays of 20-micrometer-wide by the width of the substrate, with a pitch diameter of 520 micrometers was defined. A100-nanometer-thick layer of TiW was deposited as an adhesion layer, followed by a 780-nanometer-thick inert layer comprising Au. A lift-off process was performed and the residual photoresist was removed to obtain a patterned substrate. The mask pattern comprised domains of m-stripes, with linear openings oriented approximately parallel to <10-10>. The patterned substrate was placed in a silver capsule along with a 13.4%-open-area baffle, polycrystalline GaN nutrient, $NH_4F$ mineralizer, and ammonia, and the capsule was sealed. The ratios of GaN nutrient and $NH_4F$ mineralizer to ammonia were approximately 2.99 and 0.088, respectively, by weight. The capsule was placed in an internally-heated high pressure apparatus and heated to a temperature of approximately 654 degrees Celsius for the upper, nutrient zone and approximately 677 degrees Celsius for the lower, crystal growth zone, maintained at these temperatures for approximately 230 hours, and then cooled and removed. Ammonothermal GaN grew through the linear openings in the patterned mask on the HVPE GaN substrate, grew laterally, and coalesced fully, forming an ammonothermal GaN layer approximately 340 micrometers thick with a smooth top surface. The surface of the ammonothermal GaN layer was lightly etched and examined by optical microscopy.

The window region in the ammonothermal GaN layer had an etch pit density of approximately $1.2 \times 10^6$ cm$^{-2}$ and the mask region had an etch pit density below $1 \times 10^3$ cm$^{-2}$, providing for an overall etch pit density of approximately $1 \times 10^5$ cm$^{-2}$. The coalescence fronts were manifested as an approximately linear array of threading dislocations (etch pits), with a linear concentration of approximately 2000 cm$^{-1}$.

Example 6

A c-plane oriented bulk GaN crystal grown by HVPE, approximately 0.3 millimeters thick, was provided for use as a substrate for patterning. Using nLOF2020 as a photoresist, a pattern comprising linear arrays of 20-micrometer-wide by the width of the substrate, with a pitch diameter of 1020 micrometers was defined. A100-nanometer-thick layer of TiW was deposited as an adhesion layer, followed by a 780-nanometer-thick inert layer comprising Au. A lift-off process was performed and the residual photoresist was removed to obtain a patterned substrate. The mask pattern comprised domains of m-stripes, with linear openings oriented approximately parallel to <10-10>. The patterned substrate was placed in a silver capsule along with a 13.4%-open-area baffle, polycrystalline GaN nutrient, $NH_4F$ mineralizer, and ammonia, and the capsule was sealed. The ratios of GaN nutrient and $NH_4F$ mineralizer to ammonia were approximately 2.48 and 0.090, respectively, by weight. The capsule was placed in an internally-heated high pressure apparatus and heated to a temperature of approximately 656 degrees Celsius for the upper, nutrient zone and approximately 689 degrees Celsius for the lower, crystal growth zone, maintained at these temperatures for approximately 138 hours, and then cooled and removed. Ammonothermal GaN grew through the linear openings in the patterned mask on the HVPE GaN substrate, grew laterally, and coalesced fully, forming an ammonothermal GaN layer approximately 160 micrometers thick with a smooth top surface. The surface of the ammonothermal GaN layer was lightly etched and examined by optical microscopy. The window region in the ammonothermal GaN layer had an etch pit density of approximately $1.5 \times 10^6$ cm$^{-2}$, the mask region had an etch pit density below approximately $1 \times 10^4$ cm$^{-2}$, and the coalescence fronts were manifested as an approximately linear array of threading dislocations (etch pits), with a linear concentration of approximately $1.8 \times 10^3$ cm$^{-1}$.

The laterally-grown ammonothermal layer was then placed in another silver capsule along with a 13.4%-open-area baffle, polycrystalline GaN nutrient, $NH_4F$ mineralizer, and ammonia, and the capsule was sealed. The ratios of GaN nutrient and $NH_4F$ mineralizer to ammonia were approximately 2.18 and 0.090, respectively, by weight. The capsule was placed in an internally-heated high pressure apparatus and heated to a temperature of approximately 648 degrees Celsius for the upper, nutrient zone and approximately 685 degrees Celsius for the lower, crystal growth zone, maintained at these temperatures for approximately 110 hours, and then cooled and removed. Ammonothermal GaN grew on the first, laterally-grown ammonothermal GaN layer, increasing the layer thickness to approximately 350 micrometers thick, with a smooth top surface. The surface of the ammonothermal GaN layer was lightly etched and examined by optical microscopy. The window region in the ammonothermal GaN layer had an etch pit density of approximately $1.5 \times 10^6$ cm$^{-2}$, the mask region had an etch pit density below approximately $1 \times 10^4$ cm$^{-2}$, and the coalescence fronts were manifested as an approximately linear array of threading dislocations (etch pits), with a linear concentration of approximately $1.5 \times 10^3$ cm$^{-1}$. The dislocation density after re-growth and the pattern structure of the dislocations were approximately the same as they were after the first ammonothermal lateral growth process.

Figure 13:
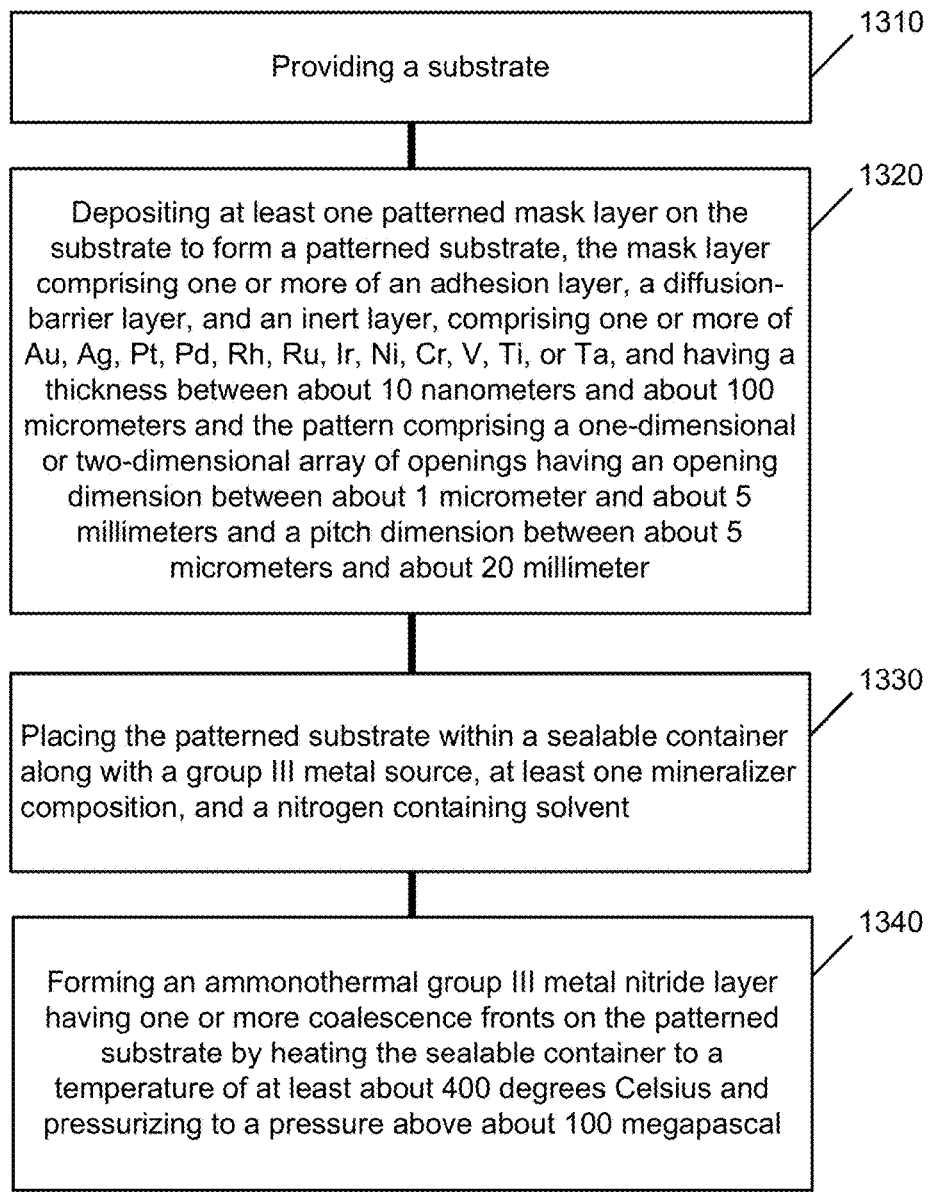
FIG. 13 is a flow chart depicting a method of making high quality group-III metal nitride crystals, according to one embodiment.

FIG. 13 is a flow chart depicting a method of making high quality group-III metal nitride crystals.

In certain embodiments, methods for forming a free-standing ammonothermal group III metal nitride crystal, comprise: providing a substrate (see step 1310); depositing at least one patterned mask layer on the substrate to form a patterned substrate, the mask layer comprising one or more of an adhesion layer, a diffusion-barrier layer, and an inert layer, comprising one or more of Au, Ag, Pt, Pd, Rh, Ru, Ir, Ni, Cr, V, Ti, or Ta, and having a thickness between about 10 nanometers and about 100 micrometers and the pattern comprising a one-dimensional or two-dimensional array of openings having an opening dimension between about 1 micrometer and about 5 millimeters and a pitch dimension between about 5 micrometers and about 20 millimeters (see step 1320); placing the patterned substrate within a sealable container along with a group III metal source, at least one mineralizer composition, and a nitrogen containing solvent (see step 1330); and forming an ammonothermal group III metal nitride layer having one or more coalescence fronts on the patterned substrate by heating the sealable container to a temperature of at least about 400 degrees Celsius and pressurizing to a pressure above about 100 MPa (see step 1340).

Still further embodiments include methods of making and methods of use. Any of the embodiments below can be practiced in a variety of variations:

In certain methods, the substrate comprises single-crystalline group-III metal nitride, gallium-containing nitride, or gallium nitride.

In certain methods, the mask layer comprises at least one of an adhesion layer and a diffusion-barrier layer comprising one or more of Ti, TiN, TiN$_y$, TiSi$_2$, Ta, TaN, Al, Ge, Al$_x$Ge$_y$, Cu, Si, Cr, V, Ni, W, TiW$_x$, TiW$_x$N$_y$, TiW$_x$, TiN$_y$, WN$_y$, TaN$_y$, TiW$_x$N$_y$, TiW$_x$Si$_z$N$_y$, TiC, TiCN, Pd, Rh, or Cr having a thickness between about 1 nanometer and about 10 micrometers and an inert layer comprising one or more of Ag, Pt, Pd, Rh, Ru, Ir, Ni, Cr, V, Ti, or Ta, and having a thickness between about 10 nanometers and about 100 micrometers.

In certain methods, the method further comprises subjecting the ammonothermal group III metal nitride layer to one or more of sawing, lapping, grinding, polishing, chemical-mechanical polishing, or etching.

In certain methods, the method further comprises depositing a second patterned mask on the ammonothermal group III metal nitride layer and performing a second ammonothermal crystal growth process on the patterned ammonothermal group III metal nitride layer.

In certain methods, the method further comprises removal of the substrate from the ammonothermal group III metal nitride layer to a form free-standing ammonothermal group III metal nitride boule.

In certain methods, the method further comprises cylindrically grinding and, optionally, slicing the free-standing ammonothermal group III metal nitride boule to form one or more free-standing ammonothermal group III metal nitride wafers, and applying one or more of lapping, grinding, polishing, etching, electrochemically polishing, photoelectrochemical polishing, reactive-ion-etching, and chemical-mechanical polishing to at least one free-standing ammonothermal group III metal nitride wafer.

In certain embodiments, the free-standing ammonothermal group III metal nitride boule, or a crystal or wafer prepared using methods provided by the present disclosure can be used as a seed crystal for further bulk crystal growth.

In certain embodiments, the further bulk crystal growth comprises ammonothermal crystal growth. In certain embodiments, the further bulk crystal growth comprises hydride vapor phase epitaxy.

In certain embodiments, a free-standing ammonothermal group III metal nitride wafer can be incorporated into a semiconductor structure, the semiconductor structure comprising at least one Al$_x$In$_y$Ga$_{(1-x-y)}$N epitaxial layer, where $0 \leq x$, y, x+y$\leq 1$.

In certain embodiments, the semiconductor structure can be incorporated into an electronic device or an optoelectronic device selected from a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and a combination of any of the foregoing.

In certain embodiments, the optoelectronic device is incorporated into a luminaire.

In certain embodiments, methods further comprise placing at least a p-type contact on a region that is substantially free of coalescence fronts.

Figure 14:
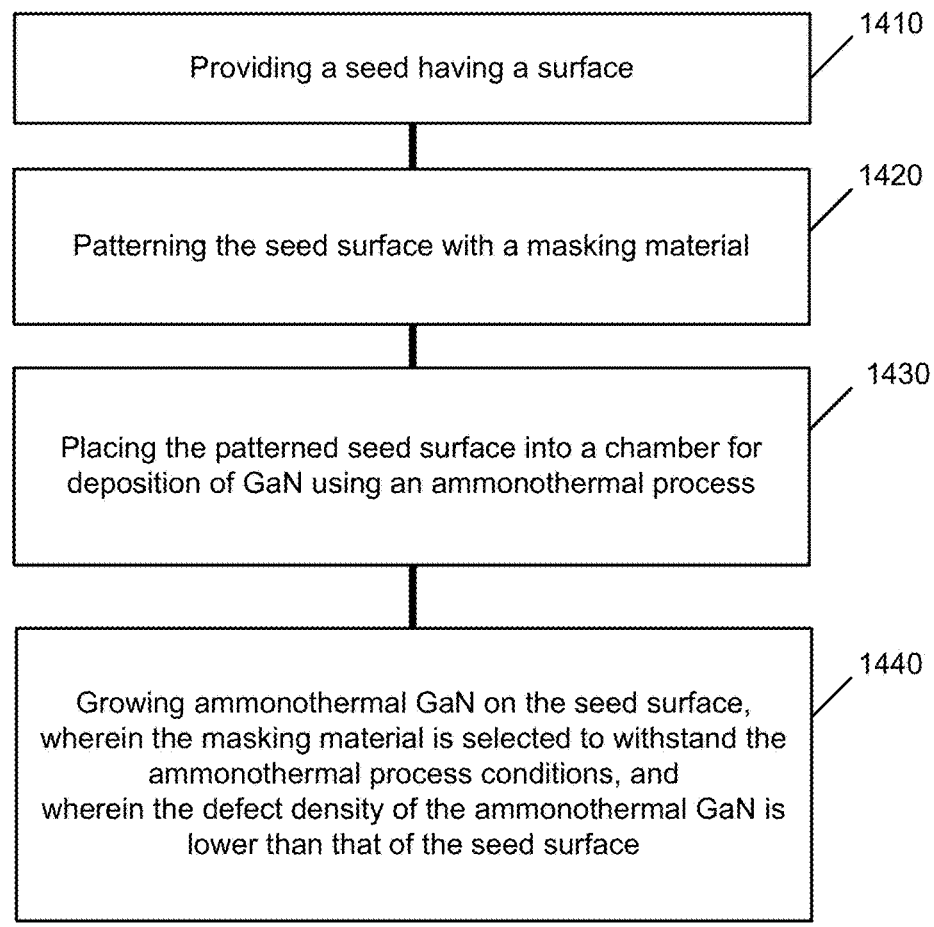
FIG. 14 is a flow chart depicting a method of making high quality group-III metal nitride crystals, according to one embodiment.

FIG. 14 is a flow chart depicting a method of making high quality group-III metal nitride crystals. The method of forming a free-standing ammonothermal group III metal nitride crystal depicted in FIG. 14, comprises: providing a seed having a surface (see step 1410); patterning the seed surface with a masking material (see step 1420); placing the patterned seed surface into a chamber for deposition of GaN using an ammonothermal process (see step 1430); and growing ammonothermal GaN on the seed surface; wherein the masking material is selected to withstand the ammonothermal process conditions; and wherein the defect density of the ammonothermal GaN is lower than that of the seed surface (see step 1440).

In addition to the foregoing, methods and processes useful in the methods provided by the present disclosure are disclosed in U.S. Pat. Nos. 7,976,630; 8,097,081, which describes a suitable internally-heated high pressure apparatus; U.S. Pat. No. 8,430,958, which discloses examples of suitable seed racks; U.S. patent application Ser. No. 14/013,753, which discloses the defective-selective etching process as applied to a range of crystallographic planes of group III metal nitride crystals; and U.S. Pat. Nos. 6,656,615 and 7,078,731 and U.S. patent application Ser. No. 13/472,356, which disclose suitable thermal cycles for ammonothermal crystal growth; each of which is incorporated by reference in its entirety.

Although the above is a full description of specific embodiments, various modifications, alternative constructions and equivalents may be used. Therefore, the above description and illustrations should not be taken as limiting the scope of the present disclosure which is defined by the appended claims.

What is claimed is:

1. A group III metal nitride crystal made from a process comprising:
   depositing at least one patterned mask layer on a substrate to form a patterned substrate, said mask layer comprising at least an inert layer comprising one or more of Au, Ag, Pt, Pd, Rh, Ru, Ir, Ni, Cr, V, Ti, or Ta, said inert layer being adhered to said substrate;
   placing said patterned substrate within a sealable container along with a group III metal source, at least one mineralizer composition, and a nitrogen containing solvent; and
   forming an ammonothermal group III metal nitride layer having one or more coalescence fronts on the patterned substrate by heating said sealable container, wherein said one or more coalescence fronts comprise a pattern of locally-approximately-linear arrays of threading dislocations, said threading dislocations having a concentration between about 5 $cm^{-1}$ and about $10^5$ $cm^{-1}$, said pattern having:
      at least one pitch dimension between about 5 micrometers and about 20 millimeters; and
      regions between said locally-approximately-linear arrays of threading dislocations having a threading dislocation density below about $10^5$ $cm^{-2}$ and a stacking-fault concentration below about $10^3$ $cm^{-1}$.

2. The crystal of claim 1, wherein the crystal comprises a group III metal selected from gallium, aluminum, indium, and a combination of any of the foregoing; and nitrogen.

3. The crystal of claim 1, wherein the first large-area surface is characterized by, a symmetric x-ray rocking curve full width at half maximum less than about 200 arcsec; an impurity concentration of H greater than about $10^{17}$ $cm^{-3}$; and an impurity concentration greater than about $10^{15}$ $cm^{-3}$ of at least one of Li, Na, K, F, Cl, Br, and I, as quantified by calibrated secondary ion mass spectrometry.

4. A bulk crystal grown on the crystal of claim 1.

5. The crystal of claim 1, wherein said mask layer comprises a discrete adhesion layer to adhere said inert layer to said substrate.

6. The crystal of claim 1, wherein said mask layer comprises a discrete diffusion barrier layer.

7. The crystal of claim 1, wherein the pattern further comprises a one-dimensional or two-dimensional array of openings having an opening dimension between about 1 micrometer and about 5 millimeters.

8. The crystal of claim 1, wherein said crystal comprises a first large-area surface having a maximum dimension greater than about 10 millimeters.

9. The crystal of claim 1, wherein said mask layer has a thickness between about 10 nanometers and about 100 micrometers.

10. The crystal of claim 1, wherein said heating said sealable container comprises heating said sealable container to a temperature of at least about 400 degrees Celsius and pressurizing it to a pressure above about 50 MPa for a duration of at least 100 hours.

11. The crystal of claim 1, wherein said inert layer comprises at least Au.

12. The crystal of claim 1, wherein the substrate consists essentially of a free-standing, bulk, gallium nitride substrate.

13. A wafer formed from a bulk crystal grown on a seed crystal derived from a group III metal nitride crystal made from a process comprising:
   depositing at least one patterned mask layer on a substrate to form a patterned substrate, said mask layer comprising at least an inert layer comprising one or more of Au, Ag, Pt, Pd, Rh, Ru, Ir, Ni, Cr, V, Ti, or Ta, said inert layer being adhered to said substrate;
   placing said patterned substrate within a sealable container along with a group III metal source, at least one mineralizer composition, and a nitrogen containing solvent; and
   forming an ammonothermal group III metal nitride layer having one or more coalescence fronts on the patterned substrate by heating said sealable container; wherein said wafer is a free-standing ammonothermal group III metal nitride crystal, wherein the crystal is characterized by a wurtzite crystal structure, and comprises at least:
      a group III metal selected from gallium, aluminum, indium, and a combination of any of the foregoing, and nitrogen; and
      a first large-area surface having a maximum dimension greater than about 10 millimeters,
         wherein the first large-area surface is characterized by,
         a symmetric x-ray rocking curve full width at half maximum less than about 200 arcsec;
         an impurity concentration of H greater than about $10^{17}$ $cm^{-3}$;
         and an impurity concentration greater than about $10^{15}$ $cm^{-3}$ of at least one of Li, Na, K, F, Cl, Br, I, as quantified by calibrated secondary ion mass spectrometry, wherein the first large-area surface comprises a pattern of locally-approximately-linear arrays of threading dislocations having a concentration between about 5 $cm^{-1}$ and about $10^5$ $cm^{-1}$, and wherein the pattern is characterized by,
            at least one pitch dimension between about 5 micrometers and about 20 millimeters; and
            regions between said locally-approximately-linear arrays of threading dislocations having a threading dislocation density below about $10^5$ $cm^{-2}$ and a stacking-fault concentration below about $10^3$ $cm^{-1}$.

14. The wafer of claim 13, wherein the first large-area surface is characterized by a crystallographic orientation within 5 degrees of a {10-10} m-plane.

15. The wafer of claim 13, wherein the first large-area surface is characterized by a crystallographic orientation within 5 degrees of a (0001) +c-plane or within 5 degrees of a (000-1)-c-plane.

16. The wafer of claim 13, wherein the first large-area surface is characterized by a crystallographic orientation within 5 degrees of a semipolar orientation selected from {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 -1±2}, {1 0 -1±3}, {2 1 -3±1}, and {3 0 -3±4}.

17. The wafer of claim 13, wherein the first large-area surface is characterized by impurity concentrations of oxygen (O), hydrogen (H), and at least one of fluorine (F) and chlorine (Cl) between about $1\times10^{16}$ $cm^{-3}$ and about $1\times10^{19}$ $cm^{-3}$, between about $1\times10^{16}$ $cm^{-3}$ and about $2\times10^{19}$ $cm^{-3}$, and between about $1\times10^{15}$ $cm^{-3}$ and about $1\times10^{19}$ $cm^{-3}$, respectively.

18. The wafer of claim 13, wherein the first large-area surface is characterized by impurity concentrations of oxygen (O), hydrogen (H), and at least one of sodium (Na) and potassium (K) between about $1\times10^{16}$ $cm^{-3}$ and about $1\times10^{19}$ $cm^{-3}$, between about $1\times10^{16}$ $cm^{-3}$ and about $2\times10^{19}$ $cm^{-3}$, and between about $3\times10^{15}$ $cm^{-3}$ and about $1\times10^{18}$ $cm^{-3}$, respectively.

19. The wafer of claim 13, wherein the wurtzite crystal structure is characterized to be substantially free of other crystal structures, the other crystal structures being less than about 1% in volume in reference to a volume of the substantially wurtzite crystal structure.

20. The wafer of claim 13, wherein the crystal is substantially free of cracks.

21. The wafer of claim 13, wherein the pattern is selected from two-dimensional hexagonal, square, rectangular, trapezoidal, triangular, and one-dimensional linear.

22. The wafer of claim 13, wherein the locally-approximately-linear arrays are oriented within about 5 degrees of a crystallographic plane selected from $\{10\text{-}1\,0\}$, $\{11\text{-}2\,0\}$, and $\{0\,0\,0\pm1\}$, and a projection of the crystallographic plane on the large-area surface.

23. The wafer of claim 13, wherein the pattern is characterized by a pitch dimension between about 200 micrometers and about 5 millimeters.

24. The wafer of claim 13, wherein a linear concentration of the threading dislocations in the pattern is less than about $1\times10^3$ cm$^{-1}$.

25. The wafer of claim 13, wherein the first large-area surface is characterized by a symmetric x-ray diffraction rocking-curve full width at half maximum value less than about 100 arcsec, an overall dislocation density below about $10^5$ $cm^{-2}$, and a dislocation density within the regions between the locally-approximately-linear arrays of threading dislocations is below about $10^4$ $cm^{-2}$.

26. The wafer of claim 13, wherein the stacking-fault concentration is below about 1 $cm^{-1}$.

27. The wafer of claim 13, further comprising a second large-area surface, wherein, the second large-area surface is substantially parallel to the first large-area surface; and the crystal is characterized by a thickness between the first large-area surface and the second large-area surface between about 0.1 millimeter and about 1 millimeter, by a total thickness variation of less than about 10 micrometers, and by a macroscopic bow less than about 50 micrometers.

28. The wafer of claim 13, wherein the impurity concentration of at least one of Li, Na, K, F, CI, Br, and I is greater than about $10^{16}$ $cm^{-3}$.

29. The wafer of claim 13, wherein the impurity concentration of H is greater than about $10^{18}$ $cm^{-3}$.

30. The wafer of claim 13, wherein a ratio of the impurity concentration of H to an impurity concentration of O is between about 1.1 and about 100.

31. A wafer from a bulk crystal grown on a seed crystal derived from a group III metal nitride crystal made from a process comprising:
   depositing at least one patterned mask layer on a substrate to form a patterned substrate, said mask layer comprising at least an inert layer comprising one or more of Au, Ag, Pt, Pd, Rh, Ru, Ir, Ni, Cr, V, Ti, or Ta, said inert layer being adhered to said substrate;
   placing said patterned substrate within a sealable container along with a group III metal source, at least one mineralizer composition, and a nitrogen containing solvent; and
   forming an ammonothermal group III metal nitride layer having one or more coalescence fronts on the patterned substrate by heating said sealable container; wherein said wafer is a free-standing ammonothermal group III metal nitride crystal, wherein said crystal is a wurtzite crystal structure and comprises at least:
   a group III metal selected from gallium, aluminum, indium, and a combination of any of the foregoing; and nitrogen; and
   a first large-area surface having a maximum dimension greater than about 10 millimeters;
   wherein the first large-area surface is characterized by:
      a symmetric x-ray rocking curve full width at half maximum less than about 200 arcsec,
      an impurity concentration of H greater than about $10^{17}$ $cm^-$, and
      an impurity concentration greater than about $10^{15}$ $cm^{-3}$ of at least one of Li, Na, K, F, CI, Br, and I, as quantified by calibrated secondary ion mass spectrometry; wherein the first large-area surface comprises regions in which the concentration of threading dislocations varies periodically by at least a factor of two in at least one direction, wherein a period of the variation is between about 5 micrometers and about 20 millimeters.

32. The wafer of claim 31, wherein the first large-area surface comprises regions in which the concentration of threading dislocations varies periodically by at least a factor of 10 in at least one direction, wherein the a period of the variation is between about between about 200 micrometers and about 5 millimeters.

* * * * *